(12) United States Patent
Zievers

(10) Patent No.: US 9,152,748 B2
(45) Date of Patent: Oct. 6, 2015

(54) COMPUTING SYSTEM WITH SWITCHING MECHANISM AND METHOD OF OPERATION THEREOF

(75) Inventor: Peter J. Zievers, Naperville, IL (US)

(73) Assignee: Xcelemor, Inc., Livermore, CA (US)

( * ) Notice: Subject to any disclaimer, the term of this patent is extended or adjusted under 35 U.S.C. 154(b) by 335 days.

(21) Appl. No.: 13/464,892

(22) Filed: May 4, 2012

(65) Prior Publication Data
US 2012/0284379 A1 Nov. 8, 2012

Related U.S. Application Data

(60) Provisional application No. 61/483,523, filed on May 6, 2011.

(51) Int. Cl.

| | |
|---|---|
| *G06F 15/16* | (2006.01) |
| *G06F 17/50* | (2006.01) |
| *G06F 15/78* | (2006.01) |
| *G06F 15/173* | (2006.01) |
| *H04L 12/707* | (2013.01) |
| *H04L 12/26* | (2006.01) |
| *H04L 12/50* | (2006.01) |
| *H04L 12/933* | (2013.01) |
| *H04L 12/947* | (2013.01) |
| *G06F 1/24* | (2006.01) |
| *G06F 9/24* | (2006.01) |
| *G06F 15/177* | (2006.01) |

(52) U.S. Cl.
CPC .......... *G06F 17/5027* (2013.01); *G06F 15/173* (2013.01); *G06F 15/781* (2013.01); *G06F 15/7803* (2013.01); *H04L 43/0811* (2013.01); *H04L 45/22* (2013.01); *H04L 49/10* (2013.01); *H04L 49/15* (2013.01); *G06F 1/24* (2013.01); *G06F 9/24* (2013.01); *G06F 15/177* (2013.01); *G06F 17/5054* (2013.01); *H04L 12/50* (2013.01); *H04L 49/101* (2013.01); *H04L 49/1515* (2013.01); *H04L 49/25* (2013.01)

(58) Field of Classification Search
CPC ... H04L 49/1515; H04L 49/25; H04L 49/101; H04L 12/50
See application file for complete search history.

(56) References Cited

U.S. PATENT DOCUMENTS

| | | | |
|---|---|---|---|
| 6,292,916 B1 | 9/2001 | Abramovici et al. | |
| 6,434,687 B1 | 8/2002 | Huppenthal | |

(Continued)

OTHER PUBLICATIONS

Kavacinski et al, Repackable Multi-plane Banyan-Type Optical Switching Fabrics, Dec. 2010, Poznan University of Technology, 4 Total Pages.*

(Continued)

*Primary Examiner* — Jeffery Williams
*Assistant Examiner* — Christopher C Harris
(74) *Attorney, Agent, or Firm* — Ishimaru & Associates LLP

(57) ABSTRACT

A method of operation of a computing system includes: calculating an initial data connection traversing a center state node of a switching network having an ingress stage, a center stage, and an egress stage; calculating a repacking route across the switching network traversing the center switching node; broadcasting an ingress portion of the repacking route simultaneously to ingress nodes of the ingress stage; broadcasting a center portion of the repacking route simultaneously to center nodes of the center stage with the ingress portion completely deployed; broadcasting an egress portion of the repacking route simultaneously to egress nodes of the egress stage with the center portion completely deployed; and deploying a repacked data connection with the repacking route traversing the center switching node across the switching network synchronously with the initial data connection.

20 Claims, 16 Drawing Sheets

(56) References Cited

U.S. PATENT DOCUMENTS

| | | | |
|---|---|---|---|
| 6,442,732 | B1 | 8/2002 | Abramovici et al. |
| 6,470,415 | B1 | 10/2002 | Starr et al. |
| 6,697,868 | B2 | 2/2004 | Craft et al. |
| 6,941,539 | B2 | 9/2005 | Hammes |
| 6,964,029 | B2 | 11/2005 | Poznanovic et al. |
| 7,120,706 | B2 | 10/2006 | Zievers |
| 7,159,049 | B2 | 1/2007 | Zievers |
| 7,162,551 | B2 | 1/2007 | Zievers |
| 7,310,333 | B1* | 12/2007 | Conklin et al. ............ 370/388 |
| 2001/0053160 | A1* | 12/2001 | Dally ....................... 370/535 |
| 2003/0193938 | A1* | 10/2003 | Ayandeh ................... 370/386 |
| 2011/0090905 | A1* | 4/2011 | Mueller et al. ............ 370/360 |
| 2011/0145447 | A1 | 6/2011 | Dimond |
| 2011/0302231 | A1 | 12/2011 | Huggett et al. |

OTHER PUBLICATIONS

Jajszczyk et al, A New Concept-Repackable Networks, Aug. 8, 1993, IEEE Transactions on Communications, vol. 41, No. 8, 6 Total Pages.*

Yang et al, Wide-Sense Nonblocking Clos Networks Under Packing Strategy, Mar. 1999, IEEE Transactions on Computers, vol. 48, No. 3, 20 Total Pages.*

Babb et al., "Virtual Wires: Overcoming Pin Limitations in FPGA-based Logic Emulators", , p. 10, Publisher: MIT Laboratory for Computer Science, Published in: Cambridge, US.

Compton et al., "An Introduction to Reconfigurable Computing", , p. 9, Publisher: Northwestern University, Published in: Evanston, US.

Gomez-Prado et al., "A Tutorial on FPGA Routing", , p. 16, Publisher: Department of Electrical and Computer Engineering. University of Massachusetts, Published in: Amherst, US.

Todman et al., "Reconfigurable computing: architectures and design methods", "IEE Proc.-Comput. Digit. Tech., vol. 152, No. 2, Mar. 2005", p. 15, Publisher: IEEE.

Vancourt et al., "Sizing of Processing Arrays for FPGA-Based Computation", , p. 6, Publisher: Boston University, Department of Electrical and Computer Engineering, Published in: Boston, US.

Yang et al., "Wide-Sense Nonblocking Clos Networks under Packing Strategy", "IEEE Transactions on Computers", Mar. 1999, pp. 265-284, vol. 48, No. 3, Publisher: IEEE, Published in: US.

Yang et al., "Wide-Sense Nonblocking Clos Networks under Packing Strategy", "IEEE Transactions on Computers", Mar. 1999, pp. 265-284, vol. 48, No. 3, IEEE, US.

* cited by examiner

1902 →

1908 {
$$\begin{vmatrix} 0 & 0 & 0 & 0 & 0 & 1 & 0 \\ 0 & 0 & 0 & 1 & 0 & 0 & 0 \\ 0 & 0 & 0 & 0 & 0 & 0 & 1 \\ 0 & 0 & 0 & 1 & 0 & 0 & 0 \\ 0 & 0 & 0 & 0 & 0 & 1 & 0 \\ 0 & 0 & 0 & 0 & 0 & 0 & 0 \\ 0 & 0 & 0 & 0 & 0 & 1 & 0 \\ 0 & 0 & 1 & 0 & 0 & 0 & 0 \\ 0 & 0 & 0 & 0 & 0 & 0 & 1 \\ 0 & & & & & & \end{vmatrix}$$

$$\begin{vmatrix} 0 & 0 & | & 0 & 0 & | & 0 & 1 & | & 0 \\ 0 & 0 & | & 0 & 1 & | & 0 & 0 & | & 0 \\ \text{-}0 & \text{-}0 & \text{-}0 & \text{-}0 & \text{-}0 & \text{-}0 & \text{-}1 & \text{-} & \text{-} \\ 0 & 0 & | & 0 & 1 & | & 0 & 0 & | & 0 \\ 0 & 0 & | & 0 & 0 & | & 0 & 1 & | & 0 \\ \text{-}0 & \text{-}0 & \text{-}0 & \text{-}0 & \text{-}0 & \text{-}0 & \text{-}0 & \text{-} & \text{-} \\ 0 & 0 & | & 0 & 0 & | & 0 & 1 & | & 0 \\ \text{-}0 & \text{-}0 & \text{-}1 & \text{-}0 & \text{-}0 & \text{-}0 & \text{-} & \text{-} \\ 0 & 0 & | & 0 & 0 & | & 0 & 0 & | & 1 \\ 0 & & | & & & | & & & | & \end{vmatrix} \rightarrow$$

2002 →

$$\begin{vmatrix} 0 & 1 & 1 \\ 0 & 1 & 0 \\ 1 & 0 & 1 \\ 0 & 0 & 1 \\ 0 & 1 & 0 \\ 1 & & \end{vmatrix}$$

$$\begin{vmatrix} 0 & \text{Red} & \text{Green} & 0 \\ \text{Red} & 0 & \text{Blue} & 0 \\ \text{Green} & 0 & 0 & \text{Red} \\ 0 & \text{Green} & 0 & \text{Blue} \end{vmatrix}$$

| Feeders \ Time | | 1 | 2 | 3 | 4 | 5 | 6 | 7 |
|---|---|---|---|---|---|---|---|---|
| Stg. 0 | Connectivity | $C_{0_0,0}$ | $C_{1_0,0}$ | $C_{2_0,0}$ | $C_{3_0,0}$ | $C_{0_1,0}$ | $C_{1_1,0}$ | $C_{2_1,0}$ |
| | Horiz. Color | 0 | 1 | 2 | 3 | 0' | 1' | 2' |
| Stg. 1 | Connectivity | x | $C_{0_0,1}$ | $C_{1_0,1}$ | $C_{2_0,1}$ | $C_{3_0,1}$ | $C_{0_1,1}$ | $C_{1_1,1}$ |
| | Horiz. Color | x | 0 | 1 | 2 | 3 | 0' | 1' |
| Stg. 2 | Connectivity | x | x | $C_{0_0,2}$ | $C_{1_0,2}$ | $C_{2_0,2}$ | $C_{3_0,2}$ | $C_{0_1,2}$ |
| | Horiz. Color | x | x | 0 | 1 | 2 | 3 | 0' |
| Stg. 3 | Connectivity | x | x | x | $C_{0_0,3}$ | $C_{1_0,3}$ | $C_{2_0,3}$ | $C_{3_0,3}$ |
| | Horiz. Color | x | x | x | 0 | 1 | 2 | 3 |

COMPUTING SYSTEM WITH SWITCHING MECHANISM AND METHOD OF OPERATION THEREOF

CROSS-REFERENCE TO RELATED APPLICATION

This application claims the benefit of U.S. Provisional Patent Application Ser. No. 61/483,523 filed May 6, 2011, and the subject matter thereof is incorporated herein by reference in its entirety.

TECHNICAL FIELD

The present invention relates generally to a computing system and more particularly to a computing system with hardware reconfiguration.

BACKGROUND ART

Electronic hardware with integrated circuits is used in virtually all electronic equipment today and have revolutionized the world of electronics. The integrated circuits are used in digital computing systems, such as computers, televisions, cellular phones, mobile devices, and digital video cameras.

The integrated circuits that enable virtually every electronics gadget used on a daily basis are constantly being pushed by the semiconductor industry to become faster. However, pure hardware implementation does not allow the flexibility to address the myriad of applications in modern computing system.

Thus, a need still remains for computing systems with flexibility of more functions as well as increased speed. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of an computing system, including: calculating an initial data connection traversing a center state node of a switching network having an ingress stage, a center stage, and an egress stage; calculating a repacking route across the switching network traversing the center switching node; broadcasting an ingress portion of the repacking route simultaneously to ingress nodes of the ingress stage; broadcasting a center portion of the repacking route simultaneously to center nodes of the center stage with the ingress portion completely deployed; broadcasting an egress portion of the repacking route simultaneously to egress nodes of the egress stage with the center portion completely deployed; and deploying a repacked data connection with the repacking route traversing the center switching node across the switching network synchronously with the initial data connection.

The present invention provides a computing system, including: a switch control for calculating an initial data connection; a loosely coupled packing pipeline, coupled to the switch control, for calculating a repacking route; and a switching network, coupled to the loosely coupled packing pipeline, for deploying a repacked data connection synchronously with the initial data connection includes: ingress nodes for receiving an ingress portion of the repacking route broadcast simultaneously to the ingress nodes, center nodes for receiving a center portion of the repacking route broadcast simultaneously to the center nodes, and egress nodes for receiving an egress portion of the repacking route broadcast simultaneously to the egress nodes.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 19 is an example of a connection matrix.

FIG. 20 is an example of a streamlined matrix.

FIG. 21 is an example of a color matrix.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

Figure 1:
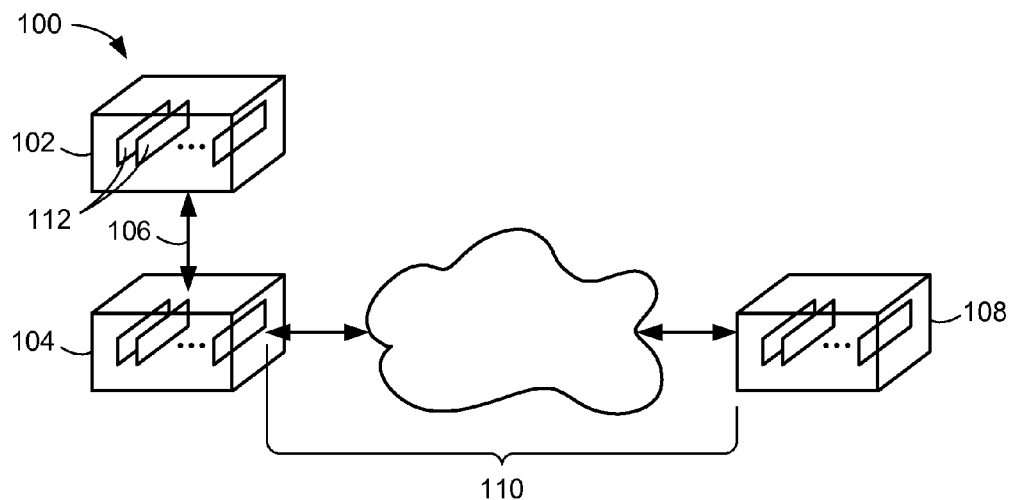
FIG. 1 is a computing system with hardware reconfiguration mechanism in an embodiment of the present invention.

Referring now to FIG. 1, therein is shown a computing system 100 with hardware reconfiguration mechanism in an embodiment of the present invention. The computing system 100 can represent an adaptive architecture execution environment.

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a non-mobile device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof. As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof. Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof. Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or any combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected together on a backplane or with cables for inside-a-box connectivity. The line cards 112 can be connected together using connectivity methods including electrical connectors, optical fiber connectors, or wave-guide connectors.

The line cards 112 can include an electronic component including an application-specific integrated circuit (ASIC), a field-programmable gate array (FPGA). For example, the line cards 112 can represent server blades, expansion cards, or interface cards for routers or switches.

Figure 2:
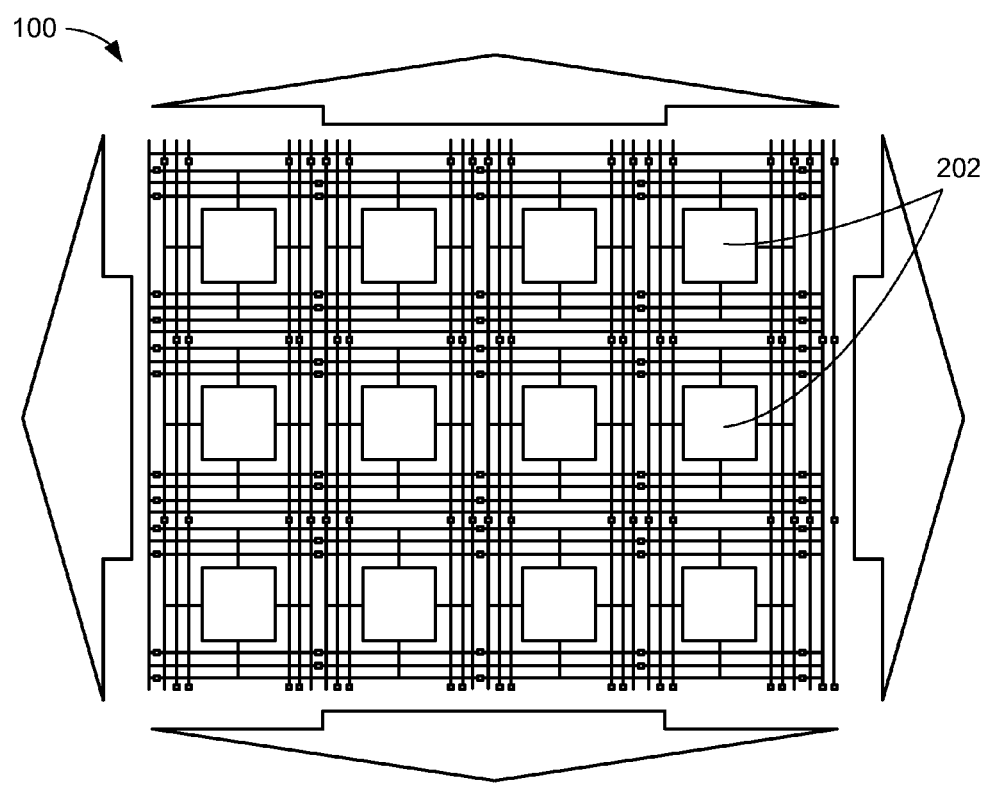
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which functionality of logic gates or units is customizable thereby providing a capability to dynamically change functions within the programmable devices.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram is depicted with arrows to indicate that any number of the reconfigurable hardware devices 202 can be placed, routed, and interconnected.

Placement, routing, and interconnections among a number of the reconfigurable hardware devices 202 can be configurable at run-time. A number of the reconfigurable hardware devices 202 can be placed and routed to interconnect or interface to one another on one or more of the line cards 112 of FIG. 1.

For example, the reconfigurable hardware devices 202 can represent the programmable devices including field-programmable gate arrays (FPGAs), programmable logic devices (PLDs), or any other programmable hardware devices. Also for example, the reconfigurable hardware devices 202 can represent target programmable devices. Further for example, interconnections between the reconfigurable hardware devices 202 can represent the first communication path 106 of FIG. 1, the second communication path 110 of FIG. 1, a backplane, or with cables for inside-a-box connectivity.

Figure 3:
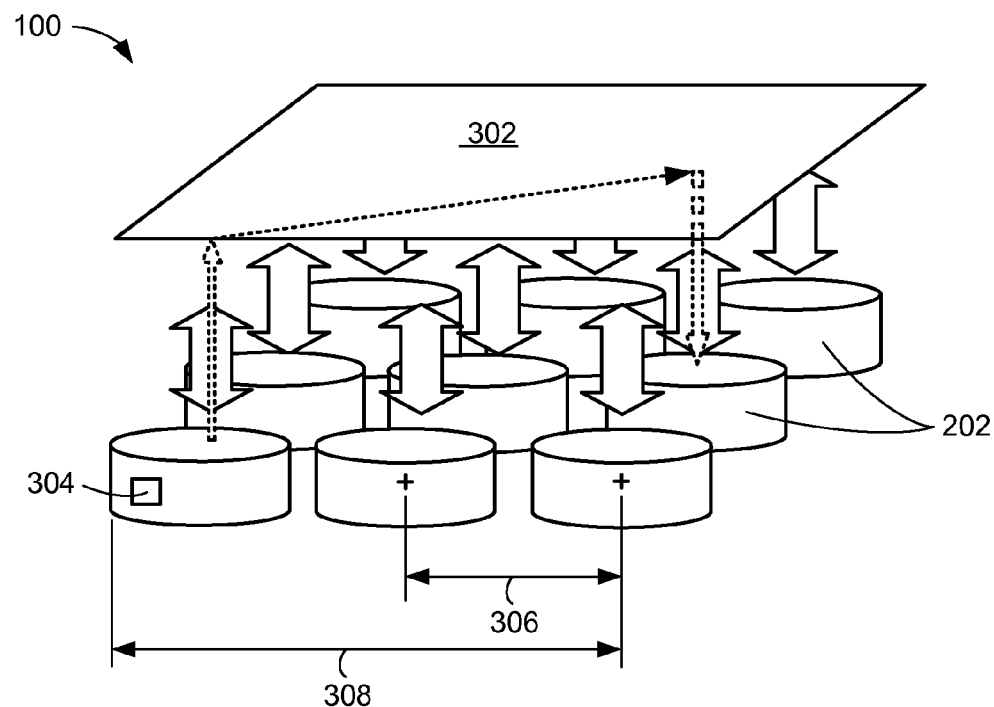
FIG. 3 is a connection diagram of a cross-connection network of the reconfigurable hardware devices.

Referring now to FIG. 3, therein is shown a connection diagram of a cross-connection network 302 of the reconfigurable hardware devices 202. The connection diagram depicts a hierarchical connection that enables the reconfigurable hardware devices 202 to be interconnected. The cross-connection network 302 is defined as an interconnection of hardware resources.

One of the reconfigurable hardware devices 202 can interface to another of the reconfigurable hardware devices 202 through the cross-connection network 302 in a path shown with dash arrows. For example, the cross-connection network 302 can represent the interconnections between the reconfigurable hardware devices 202.

Delay incurred by traversing the cross-connection network 302 can be regulated by managing a number of hierarchical levels in the cross-connection network 302 at implementation time. The implementation time is a time when the reconfigurable hardware devices 202, the line cards 112 of FIG. 1, and a combination thereof are connected together through the cross-connection network 302 before the reconfigurable hardware devices 202 and the line cards 112 are available for operation.

The delay can also be regulated by managing a locality of an application 304 at run-time. The application 304 is defined as a process that is to be launched by a user and executed by the reconfigurable hardware devices 202 in the computing system 100. For illustration purposes, one of the reconfigurable hardware devices 202 is shown to execute the application 304, although it is understood that any number of the reconfigurable hardware devices 202 can be allocated to execute the application 304.

The locality can be provided by mapping the application 304 to one of the reconfigurable hardware devices 202 or multiple of the reconfigurable hardware devices 202 that are within a predetermined distance 306 from each other. The predetermined distance 306 is a distance between centers of the reconfigurable hardware devices 202 that that is less than a distance threshold 308 to ensure a propagation delay less than a fixed numerical value. The distance threshold 308 is a predefined numerical value for determining whether the reconfigurable hardware devices 202 are locally or closely located to each other.

The cross-connection network 302 can include management functions to be effective. A number of the application 304 can discreetly avail themselves of network management functionality through a control interface, leaving complex network maintenance to logic that operates separately from the number of the application 304.

A single application management approach can pre-empt or prevent occurrences of mismatched approaches, which are multiple methods of a variety of sub-systems having conflicting effects in an overall system. The single application management approach provides a single coordination to ensure resources are available for use.

For example, the occurrences can include resource leakage, resource collision, resource starvation, application deadlock, namespace conflict, cross-thread run-time synchronization failure, and cross-thread communication disconnect. As a specific example, the resource leakage occurs when applications do not use the resources available. As another specific example, the resource collision occurs when multiple devices or processes access the same instances of the resources.

As another specific example, the resource starvation occurs when the resources are not allocated for execution of a process because they are used for execution of another process having a higher priority than the process. As another specific example, the application deadlock occurs when two or more processes are simultaneously waiting for each other to free up the resources.

Application logic that is not able to be fit or implemented into a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the application 304 can coexist in the computing system 100 and therefore can use the same system resources including a memory control interface (not shown) and a network control interface (not shown). Consistency of the application synchronization that applies the same terms and protocols can promote application independence and therefore scalability.

Figure 4:
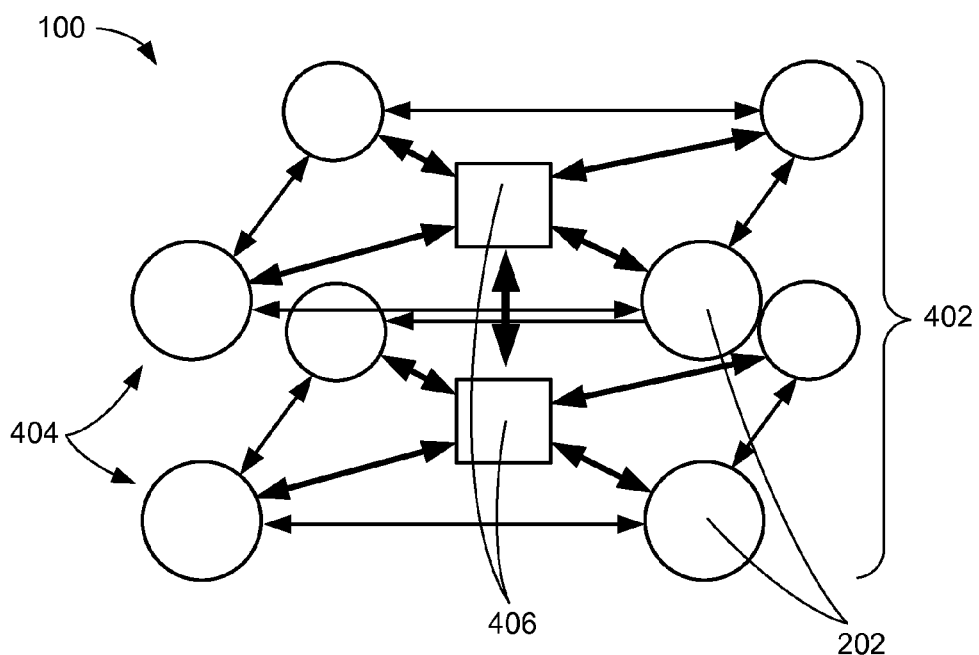
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together.

Each of the clusters 404 is defined as a collection of the reconfigurable hardware devices 202 connected to kernel units 406, whereby the reconfigurable hardware devices 202 are locally located with respect to one another. The term "locally located" refers to the reconfigurable hardware devices 202 within the predetermined distance 306 of FIG. 3 from one another. The computing system 100 can include a number of the clusters 404 connected together through a number of the kernel units 406. Each of the kernel units 406 is defined as a management hardware that includes application management, communication, and synchronization functionality.

The connection diagram depicts the tandem kernel 402 having a first of the kernel units 406 connected to a second of the kernel units 406, with each of the first of the kernel units 406 and the second of the kernel units 406 having four instances of the reconfigurable hardware devices 202. Within the tandem kernel 402, one of the reconfigurable hardware devices 202 of the first of the kernel units 406 can interface with one of the reconfigurable hardware devices 202 of the second of the kernel units 406.

One of the reconfigurable hardware devices 202 can interface with another of the reconfigurable hardware devices 202 within one of the clusters 404 preferably through one of the kernel units 406 of the one of the clusters 404. Optionally, one of the reconfigurable hardware devices 202 of one of the clusters 404 can interface directly with another of the reconfigurable hardware devices 202 of the one of the clusters 404. A number of the kernel units 406 and interconnections between the reconfigurable hardware devices 202 and the number of the kernel units 406, among the number of the kernel units 406, among the reconfigurable hardware devices 202, or a combination thereof can represent portions of the cross-connection network 302 of FIG. 3.

It has been discovered that each of the clusters 404 having one of the kernel units 406 provides improved dynamic allocation of hardware resources because the application 304 of FIG. 3 can be fragmented, mapped, and executed with any number of the reconfigurable hardware devices 202 interface with each other through the one of the kernel units 406.

It has also been discovered that any number of the reconfigurable hardware devices 202 directly interface with each other within one of the clusters 404 provides improved performance with less delays through direct connections as well as provides reduced cost and complexity.

Figure 5:
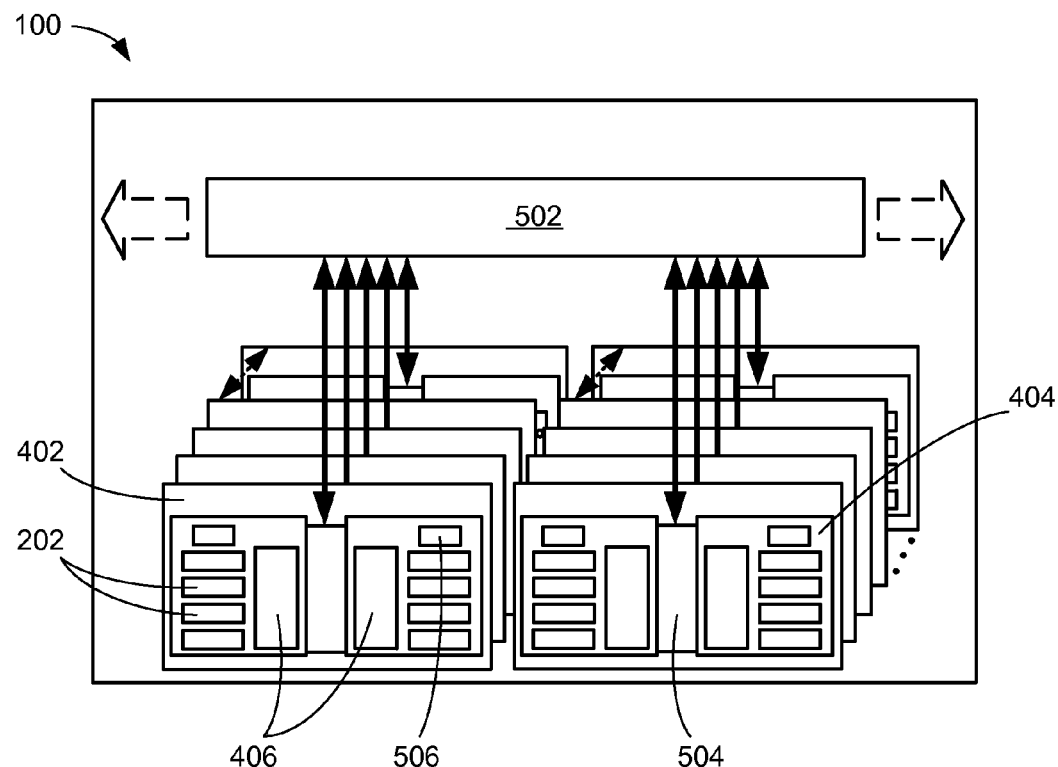
FIG. 5 is a hardware block diagram of the computing system.

Referring now to FIG. 5, therein is shown a hardware block diagram of the computing system 100. The computing system 100 includes a hardware platform with a number of the kernel units 406, a number of the reconfigurable hardware devices 202, and a communication network 502 that can be engaged and interworking altogether as a system.

The computing system 100 includes a dynamic reconfigurable computing platform without any external software intervention during real-time operation. For example, the computing system 100 can provide a complete hardware platform.

The communication network 502 provides an interface and connectivity for the tandem kernel 402 to communicate with another of the tandem kernel 402. The communication network 502 can include switches and communication protocols for sending information and data between one of the kernel units 406 of the tandem kernel 402 to one of the kernel units 406 of another of the tandem kernel 402.

The tandem kernel 402 can include a communication interface 504 to provide communication between the tandem kernel 402 and another of the tandem kernel 402. The communication interface 504 can also provide communication between one of the kernel units 406 and another of the kernel units 406. For example, the communication interface 504 can represent a network interface.

The communication interface 504 can be used for one of the kernel units 406 of the tandem kernel 402 to communicate with one of the kernel units 406 of another of the tandem kernel 402 through the communication network 502. The communication network 502, the communication interface 504, a number of the kernel units 406, or a combination thereof can represent portions of the cross-connection network 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 100 can accommodate a number of different models of the reconfigurable hardware devices 202, each of which can include different input/output (I/O) densities and different computing resources. Suitability of the reconfigurable hardware devices 202 can depend on an application descriptor 506, which is defined as information regarding a make-up or an attribute of the application 304 of FIG. 3 that determines how the reconfigurable hardware devices 202 are to be allocated for implementing the application 304. The application descriptor 506 can include resource requirements for implementing the application 304 of FIG. 3.

The application descriptor 506 can include the operation feature including input/output-intensive (I/O-intensive) or compute-intensive, among other characteristics. For example, the application descriptor 506 can be used to determine a mix of the application 304.

I/O-intensive refers to the application 304 that is preferably mapped to programmable hardware resources with a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the application 304 that is preferably mapped to programmable hardware resources with a high compute resource capacity. Compute-intensive applies to the application 304 that demands a lot of computation compared to I/O-intensive that requires more input/output operations.

The application 304 that is I/O-intensive can be placed, routed, and executed more efficiently using a selected model of the reconfigurable hardware devices 202 that is designed for I/O-intensive applications than those for compute-intensive applications. The application 304 that is compute-intensive can be placed, routed, and executed more efficiently using a different model of the reconfigurable hardware devices 202 that is designed for resource-intensive than those for I/O-intensive.

The computing system 100 can be tuned or configured by mixing the clusters 404 differently based on the application descriptor 506. The clusters 404 can represent kernel planes. For example, the application descriptor 506 of the application 304 can be particularly I/O-intensive but the application 304 has compute-intensive ancillary functionality that is most frequently unused.

In the example above, the clusters 404 populated with high I/O density instances of the reconfigurable hardware devices 202 can be employed for execution of basic functionality of the application 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for implementing a functionality of the application 304 based on an actual capacity (or size) and an actual I/O density of the reconfigurable hardware devices 202 that are used to map the application 304. As an application mix of a number of the application 304 runs in the computing system 100, performance can be measured and a mix of the clusters 404 can be adjusted according to actual run-time characteristics. The application mix refers to the number of the application 304 that need to be mapped to resources that are I/O-intensive, compute-intensive, or a combination thereof.

Placement of the clusters 404 can depend on the application mix. If an I/O-intensive functionality of the application 304 is localized in the reconfigurable hardware devices 202, the clusters 404 that are I/O-intensive can be clustered together, thereby decongesting the communication network 502 of the computing system 100. If an I/O-intensive functionality of the application 304 functions as a hub for a compute-intensive functionality, the clusters 404 that are I/O-intensive can be distributed amongst the clusters 404 that are compute-intensive.

Figure 6:
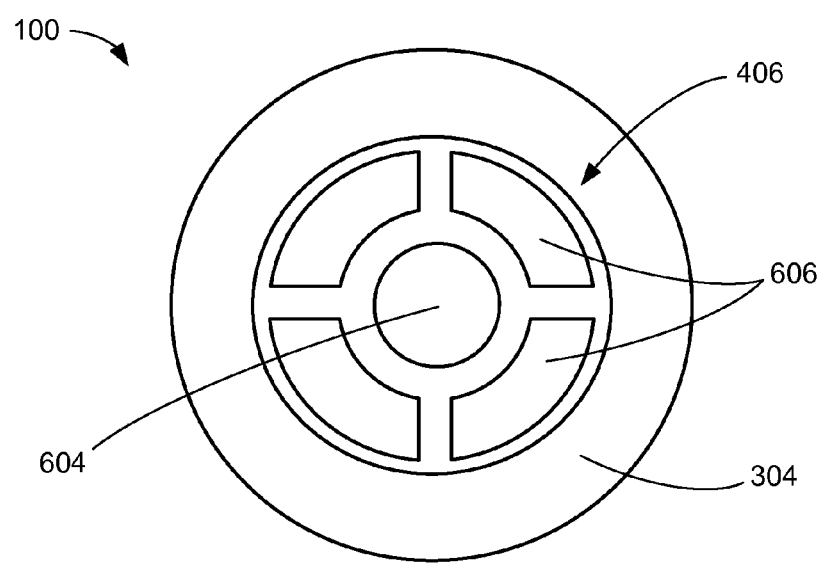
FIG. 6 is an architecture diagram of the application in the computing system.

Referring now to FIG. 6, therein is shown an architecture diagram of the application 304 in the computing system 100. Each of the kernel units 406 can include a microkernel 604 and kernel modules 606. The microkernel 604 can provide control, management, and communication capabilities for each of the kernel units 406 to interface with the reconfigurable hardware devices 202 of FIG. 2 to implement and execute functionality of the application 304.

The kernel modules 606 augment functionality of the microkernel 604 by providing additional control and management capabilities that are not implemented in the microkernel 604. The kernel units 406 can be configured for the application 304 by compiling and synthesizing the kernel modules 606 expressly chosen for an application domain of the application 304. The application 304 can be loaded and executed on the reconfigurable hardware devices 202.

The application domain refers to a type of a number of the application 304 that are grouped based on similar functionalities. The application domain depends on problems that the number of the application 304 is implemented to solve. For example, the application domain can include encryption, computer vision, and synthetic-aperture radar that can be supported with high-performance computing functionalities implemented in the number of the application 304.

The application 304 can be launched in a layer outside each of the kernel units 406 having the microkernel 604 and the kernel modules 606. For example, the application 304 can be developed using a programming language including C++ and VHSIC hardware description language (VHDL) where VHSIC stands for very-high-speed integrated circuits. Also for example, the application 304 can be developed with Open Computing Language (OpenCL) programs and compiled to run with an execution platform with only hardware using the reconfigurable hardware devices 202.

The application 304 can be mapped to and executed by the reconfigurable hardware devices 202. A method of mapping and implementing a representation or a bitstream of the application 304 can be managed by each of the kernel units 406 with the microkernel 604 and the kernel modules 606.

Figure 7:
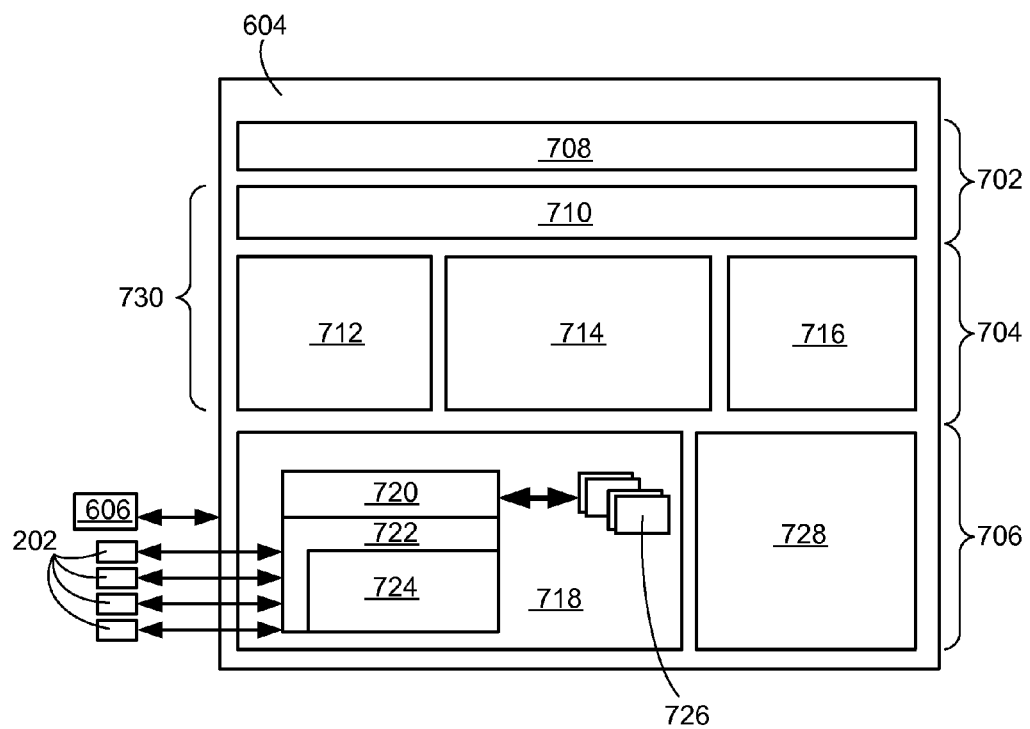
FIG. 7 is a hardware block diagram of the microkernel.

Referring now to FIG. 7, therein is shown a hardware block diagram of the microkernel 604. The microkernel 604 can be implemented with vital functions common to various types of a number of the application 304 of FIG. 3 that operates in a similar fashion across all application domains. The microkernel 604 does not operate in a stand-alone form but instead with the kernel modules 606.

The microkernel 604 can include operation functions including communications, logic multiplexing, security primitives, job scheduling, and distributed control. The microkernel 604 is an interworking system of sub-functions, organized as shown in FIG. 7. The microkernel 604 can include the sub-functions that are stratified into three layers including a control layer 702, a support layer 704, and a run-time layer 706.

The control layer 702 performs a job control and includes a microkernel interface (not shown). The control layer 702 can include a user interface unit 708 and an application manager 710 for performing control functions including session management, control plane security, and job scheduling.

The support layer 704 provides scheduling support and network management. The support layer 704 can include a module manager 712, a resource manager 714, and an event manager 716 for performing support functions including scenario validation, event handling, and remote kernel interface management.

The run-time layer 706 provides an application run-time plant. The run-time layer 706 can include run-time blocks including an intra-cluster communication unit 718 having a buffer manager 720 and a virtual bus 722 with a switch fabric 724. The run-time layer 706 can include the run-time blocks including a number of memory devices 726 and an inter-cluster communication unit 728. The run-time layer 706 can include the run-time blocks for performing run-time functions including interfacing with the reconfigurable hardware devices 202 and performing application fragment interconnect, signal management, network interface, and network and application interface security.

The microkernel 604 can include a schedule engine 730 for scheduling portions of a number of the reconfigurable hardware devices 202. The schedule engine 730 can include the application manager 710, the module manager 712, the resource manager 714, and the event manager 716 to support the scheduling.

Sub-blocks of the control layer 702, the support layer 704, and the run-time layer 706 can be connected to each other, the reconfigurable hardware devices 202, and the kernel modules 606. The control layer 702 can interface with the kernel modules 606 and the support layer 704. The support layer 704 can interface with the control layer 702 and the run-time layer 706. The run-time layer 706 can interface with the support layer 704, the reconfigurable hardware devices 202, and the kernel modules 606.

The microkernel 604 can be implemented as a functional foundation for the computing system 100 of FIG. 1, upon which the application 304 can be built such that the application 304 is secure and seamless. The microkernel 604 can embody a coherent collection of functionality appropriate for implementing the application 304.

The microkernel 604 can provide primitives that implement functionality including application module scheduling and maintenance, seamless application fragment interaction, and high-performance application communication. The term "primitives" refers to a simple operation for executing a relatively more complex operation than the simple operation. For example, the primitives can represent low-level commands that are used to execute relatively high-level commands.

For example, the application module scheduling and maintenance can include thread maintenance and module swapping. Also for example, the seamless application fragment interaction can include interconnection and synchronization.

The thread maintenance monitors instantaneous application needs and regulates allocation of resources to the application 304. The thread maintenance is performed for multiple applications or processes.

For example, the thread maintenance can monitor the instantaneous application needs of the application 304 and allocate ancillary logic of the reconfigurable hardware devices 202 that has been swapped out to be used by the application 304. The term "ancillary" refers to spare logic gates that are swapped in to implement a function and swapped out to be available to implement another function when the spare logic gates are subsequently needed. Also for example, the thread maintenance can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control and management of pipeline stalls involving pipelines that span the application grain boundaries. The term "fragment" refers to a portion of the application 304.

The microkernel 604 can also provide for bus interconnection and reliable delivery of application signal information from outputs to fanned-out inputs at application fragment grain boundaries. The application fragment grain boundaries are perimeters of groups of programmable blocks in the reconfigurable hardware devices 202, where interconnects or wires are connected between the groups.

For the high-performance application communication, the microkernel 604 can provide a low-overhead communication infrastructure to the application 304 developed as any combination of software and hardware on top of or outside the microkernel 604 and the kernel modules 606. Wrappers or interfaces for the application 304 can be written in hardware or software outside the microkernel 604 and the kernel modules 606 to seamlessly adapt the low-overhead communication infrastructure to a number of protocols.

Figure 8:
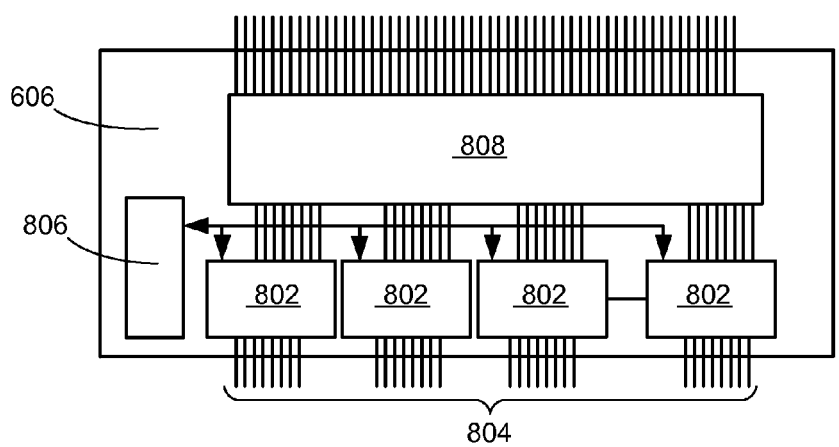
FIG. 8 is an architecture diagram of one of the kernel modules.

Referring now to FIG. 8, therein is shown an architecture diagram of one of the kernel modules 606. Each of the kernel units 406 of FIG. 4 can include the kernel modules 606 in addition to the microkernel 604 of FIG. 6 to provide hardware platform functionality that can spread across a number of the line cards 112 of FIG. 1, the tandem kernel 402 of FIG. 4, the kernel units 406, or a combination thereof. The kernel units 406 can be shaped or configured for the application domain with the kernel modules 606.

Each of the kernel modules 606 can include a microkernel interface unit 802. The microkernel interface unit 802 provides communication capability for each of the kernel modules 606 to communicate with the microkernel 604 through a kernel expansion bus 804. The kernel expansion bus 804 provides connectivity between the microkernel interface unit 802 and the microkernel 604.

The microkernel interface unit 802 can support a variety of bus widths and protocols appropriate to functionality of the microkernel 604. Each of the kernel modules 606 can include a security unit 806 to monitor a kernel module security status and determine whether each of the kernel units 406 operates in a secured mode.

Each of the kernel modules 606 can include a configurable functionality unit 808 that interfaces between the microkernel interface unit 802 and user logic devices. The user logic devices are non-kernel logic devices that are implemented outside the kernel units 406. The user logic devices can be used to transmit application related information of the application 304 of FIG. 3 to the kernel units 406 for authentication, configuration, and management of the reconfigurable hardware devices 202 of FIG. 2. For example, the configurable functionality unit 808 can interface with the user logic devices through a communication bus including Peripheral Component Interconnect (PCI) or a system bus on a motherboard or a system board.

The configurable functionality unit 808 includes developed supplemental logic to support a number of configuration functionalities. For example, the configuration functionalities can be associated with the policy including module swapping rules, privilege and authentication rules, scheduling rules, function cache allocation, database management, and managing events and event relationships. Also for example, the configuration functionalities can be associated with interface domain diversity, high-usage application domain functions, issues of waiting logic, and system scalability.

For a specific example, interface domain diversity can imply behavioral sub classification. In other words, the kernel modules 606 house or include interface functionality based on a sub-classification because different interface domains have different characteristics. For instance, the different characteristics or differentiation can be based on speed and latency. Latency can be affected by inherent equipment constraints or by physical distance between nodes that represent locations of the reconfigurable hardware devices 202.

The kernel modules 606 can be implemented with the functionalities based on application parameters or features that are not implemented in the microkernel 604. For example, the kernel modules 606 can be implemented with functionalities including supports for shell programs and file systems.

The microkernel 604 and the kernel modules 606 can be implemented with any number of electronic components including an application-specific integrated circuit (ASIC), a field-programmable gate array (FPGA). For example, the microkernel 604 and the kernel modules 606 can altogether be implemented with an ASIC, an FPGA, or a combination thereof.

Figure 9:
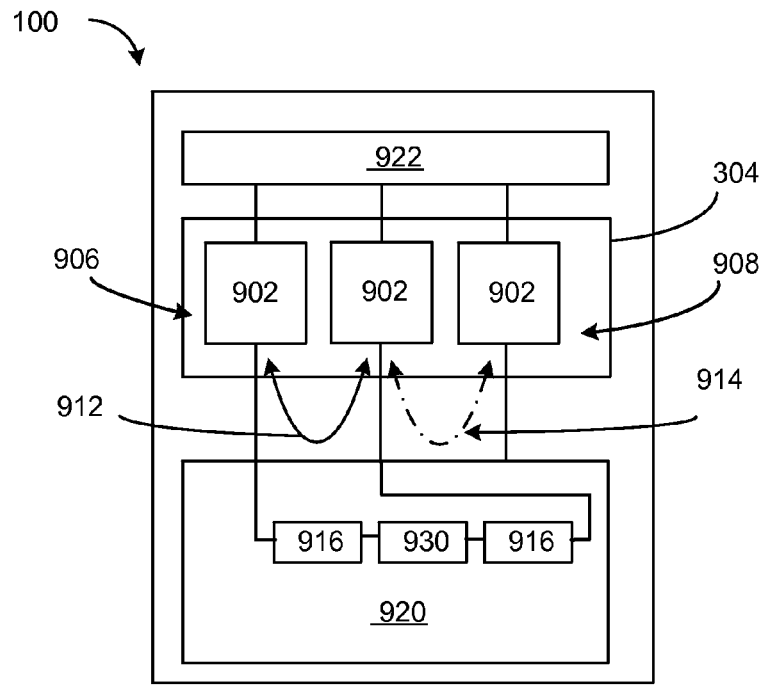
FIG. 9 is an exemplary block diagram of data connections.

Referring now to FIG. 9, therein is shown an exemplary block diagram of data connections 912. The computing system 100 can include the application 304 partitioned into application fragments 902 interconnected with a control plane 922 and a data plane 920.

The application fragments 902 are subsets of the application 304 acting as functional blocks of reconfigurable hardware. The control plane 922 is the interconnect mechanism for transferring control information between elements of the computing system 100. The data plane 920 is the interconnect mechanism for transferring data between elements of the computing system 100. The data plane 920 can include control signals for managing the transfer of data.

The control plane 922 can transport timing information, status information, control information, or a combination thereof. The control plane 922 can include control lines, control busses, multiplexed connections, network interconnects, or similar control signal structures. For example, the control plane 922 can be a dedicated control line.

The data plane 920 can transport application information, configuration information, user data, system information, or a combination thereof. The data plane 920 can include data buses, data interconnections, bitstreams, data switching structures, buffers, pipelines, or a combination thereof.

The data plane 920 can interconnect the application fragments 902 into sets of the application fragments 902 to form the application 304. The data plane 920 can be switched, rearranged, dynamically modified, and reconfigured to suit arbitrary topologies. For example, the data plane 920 can support arbitrary reconfiguration that can be achieved at sub-microsecond latencies without side-effects, such as fragmented internal interconnect.

The data plane 920 can connect two of the application fragments 902 of the computing system 100 with data connections 912. The data connections 912 can support buffering of data by temporarily storing data in signal buffers 916. The signal buffers 916 can be memory storage areas in physical memory. The data connections 912 can represent data traffics including control signals, data information, bitstreams, or a combination thereof.

The module manager 712 of FIG. 7 can manage the formation and operation of the data connections 912 between application fragments 902. The module manager 712 can form the data connections 912, such as an initial data connection, a repacked data connection, or a combination thereof.

The data connections 912 can be paths for the transfer of data between data sources 906 and data destinations 908. The data sources 906 can be suppliers of data to another element. The data sources 906 can be the application fragments 902 of the microkernel 604 of FIG. 6, the signal buffers 916, or a combination thereof. The data destinations 908 can be receivers of data from another element. The data destinations 908 can be the application fragments 902 of the microkernel 604, the signal buffers 916, another of the application fragments 902 on another microkernel 604, or a combination thereof.

The data plane 920 can manage buffering between the data sources 906 and the data destinations 908 using application feedback tin the data plane 920. The application feedback can be distributed based on the data flow needs of the application fragments 902.

The data connections 912 can include a termination status 914. The termination status 914 can indicate when the use of one of the data connections 912 has completed and the resources of the data connections 912 can be reused.

The data plane 920 can include switch blocks 930 to route the data connections 912 from the data sources 906 to the data destinations 908. The switch blocks 930 are hardware elements forming in the reconfigurable hardware devices 202 of FIG. 2 that can act as a crossbar equivalent network and can be combined to switch any input to any output as in a crossbar network.

The control plane 922 can manage the operation of the computing system 100 while maximizing performance measured as overall utilization against demand by routing control information. The control plane 922 employs feedback from both the data plane 920 and the control plane 922. The control plane 922 can automatically adjust the parameters governing the operation of the data plane 920 based on the fed-back and fed-forward inputs. The feedback and feed forward inputs can include the backpressure inputs, ready inputs, or a combination thereof.

Figure 10:
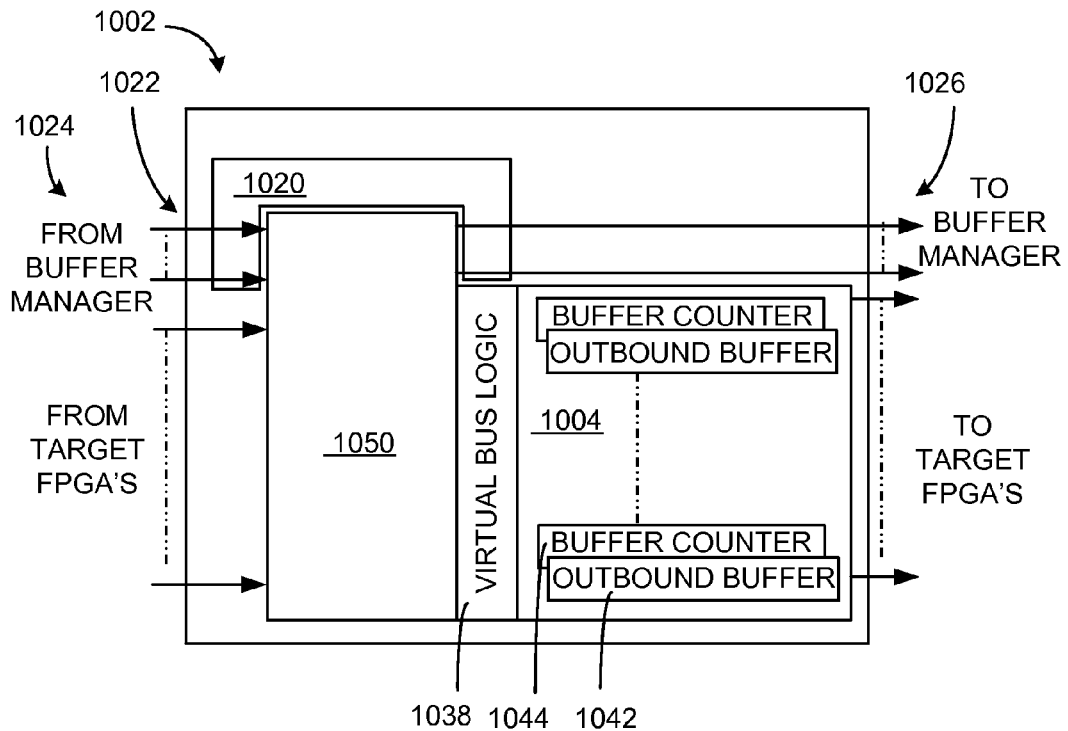
FIG. 10 is an exemplary block diagram of a switch complex of the intra-cluster communication unit.

Referring now to FIG. 10, therein is shown an exemplary block diagram of a switch complex 1002 of the intra-cluster communication unit 718 of FIG. 7. The computing system 100 of FIG. 1 can include the intra-cluster communication unit 718 having the switch complex 1002 for switching data within the one of the clusters 404 of FIG. 4. The intra-cluster communication unit 718 can manage communication of control and data signals between the application fragments 902 of FIG. 9 operating in the reconfigurable hardware devices 202 of FIG. 2.

The switch complex 1002 can form the data connections 912 of FIG. 9 for transferring control and data signals to the data destinations 908 of FIG. 9. The switch complex 1002 can include a switching network 1050 that can be formed using the switch blocks 930 of FIG. 9. For example, the data sources 906 of FIG. 9 can generate data and can include the application fragments 902, the signal buffers 916 of FIG. 9, the application fragments 902 of another of the microkernel 604 of FIG. 6, or a combination thereof. The data destinations 908 can receive data and can include the application fragments 902, the signal buffers 916 of FIG. 9, the external applications, the kernel units 406 of FIG. 4, or a combination thereof.

The switch complex 1002 supports the real-time streaming of application signals and data. The switch complex 1002 can include the switching network 1050, such as a Benes network, a Clos network, a Clos fabric, a multi-stage network, or other crossbar equivalent network. The switching network 1050 can be dynamically reconfigured to change the routing of data without incurring a data delay due to the reconfiguration of the switching network 1050. The switching network 1050 having the switch blocks 930 can be implemented using the reconfigurable hardware devices 202 of FIG. 2.

The switch complex 1002 can include a virtual bus logic unit 1038 for the managing the virtual bus 722 of FIG. 7 having output data buffers 1042 for transferring data to the target instance of the reconfigurable hardware devices 202 of FIG. 2. The virtual bus 722 can represent the data connections 912 between the data sources 906 and the data destinations 908.

The intra-cluster communication unit 718 can include the output data buffers 1042 that are capable of rolling back the signal buffers 916 when application feedback requires replay of application data in the data connections 912. Rolling back the signal buffers 916 is the action of recording a stream of signals in the signal buffers 916 and recreating the stream of data at an arbitrary location within the signal buffers 916. For example, if the application feedback can include the condition where the application fragments 902 of the application 304 of FIG. 3 have been relocated and the data connections 912 can be rolled back to resend the data to the new location of the application fragments 902.

The switch complex 1002 can include a rollback logic unit 1004 having the output data buffers 1042 and buffer counters 1044. Replay of the application signaling is defined as recreating output of one of the application fragments 902 by repeating the submission of previously used data.

The intra-cluster communication unit 718 can be controlled with a command interface. The command interface is the mechanism for passing control information between two components of the computing system 100. The command interface can be implemented using the control plane 922 of FIG. 9. The command interface can be implemented as a non-multiplexed separate instance of a command control bus with access to the individual instances of the switch blocks 930 of FIG. 9 via parallel serial ports, a shared parallel port, or a combination thereof. The command interface may be multiplexed into the data path or may be separate.

For example, if parallel serial ports are used, then the switch blocks 930 can be partitioned into groups that are supported by each serial interface. If the parallel port is used, then the switch blocks 930 can listen to the shared port for control information from the same shared serial port.

The switch complex 1002 can include a switch control interface and a streaming data interface for controlling the switching network 1050. The switch complex 1002 can be controlled using a switch control 1020, for processing control signals and commands sent to the switch complex 1002. The switch control 1020 is a hardware unit for passing control information to the switching network 1050.

The switch control 1020 can traverse a dedicated control bus, a multiplexed control and data interface, or a combination thereof. For example, if the dedicated control bus is used, then the control traffic is entirely segregated from application data traffic, and the interface can be implemented as a simple bus. The switch control 1020 can be coupled to the virtual bus logic unit 1038.

In another example, the switch control 1020 can be multiplexed and the multiplexed control and data interface allows control information to enter and leave the switching network 1050 through the switched ports connected to the buffer manager 720 of FIG. 7. When the virtual bus 722 associated with a buffer manager interface port 1022 bears application data, the control information may not pass through the buffer manager interface port 1022. If the virtual bus 722 associated with the buffer manager interface port 1022 is flow controlled or the buffer manager interface port 1022 is not bound to the virtual bus 722, then control information is enabled to pass through the buffer manager interface port 1022.

The switch complex 1002 can operate in a multiplex mode, allowing the control and data information to be combined and routed together. For example, a buffer manager input path 1024 and a buffer manager output path 1026 can both pass through the switch control 1020 to indicate a multiplexed control and data interface.

A command stub processes switch control primitives and generates responses once the command has been staged. The stub logic coordinates and diffuses activity implied by a command.

The streaming application data interface can indicate the path between the switch complex 1002 and the target ports of the reconfigurable hardware devices 202. The streaming application data interface is for transmission of data and application flow control.

The streaming application data interface can be formed using bidirectional switch ports that are asymmetrically mixed with unidirectional ports to support flexible application fan-outs. The direction of the bidirectional switch ports can be changed at run-time.

When the data plane 920 of FIG. 9 is multiplexed, such as a bit slice configuration, all ports in the schedule for the physical port must either support ingress data flow or egress data flow. That is, a single multiplexed physical port cannot interleave both ingress and egress data flows.

Figure 11:
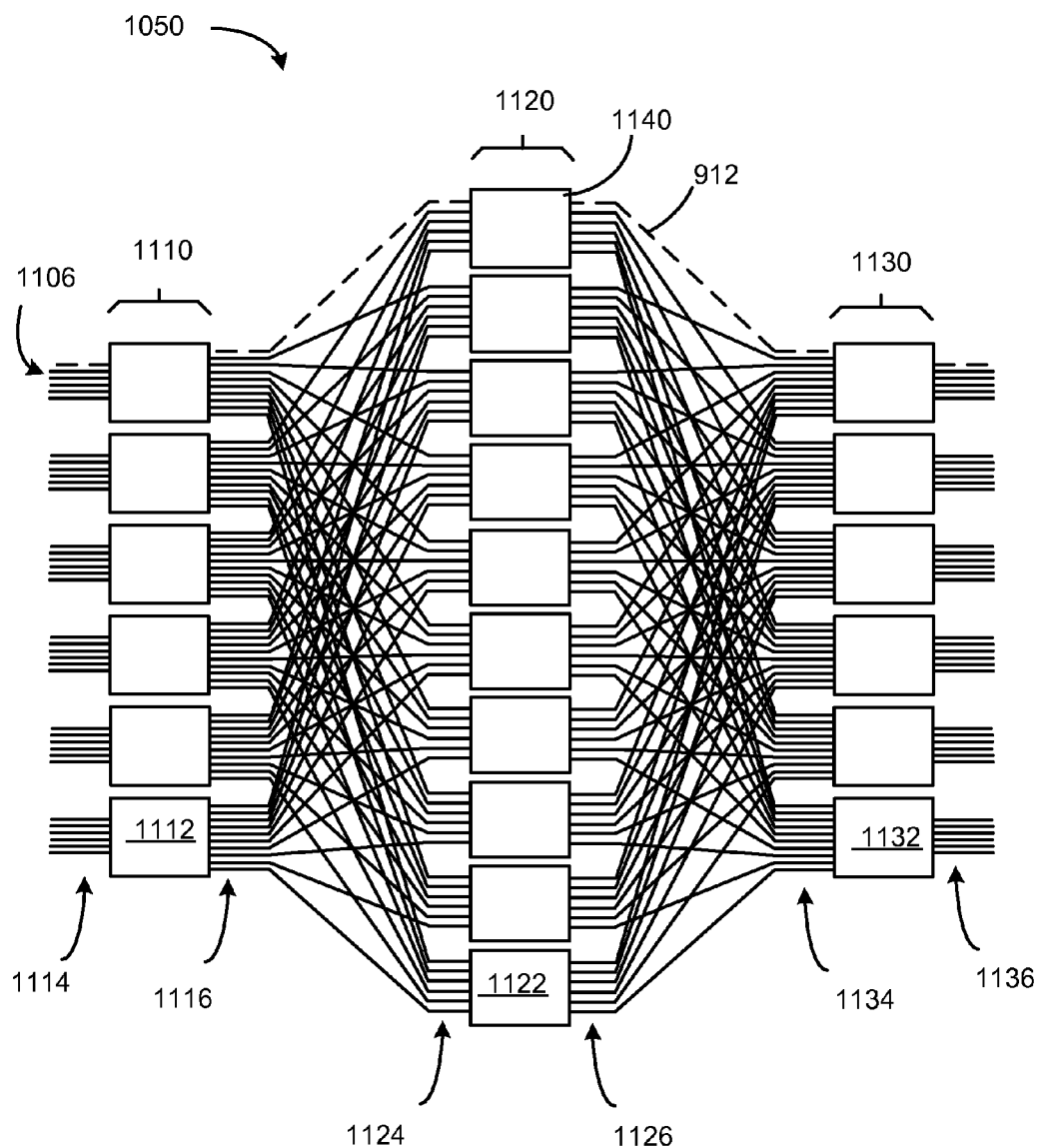
FIG. 11 is an example of the switching network.

Referring now to FIG. 11, therein is shown an example of the switching network 1050. The switch complex 1002 of FIG. 10 includes the switching network 1050 for routing the data connections 912 to the data destinations 908 of FIG. 9.

The switching network 1050 is crossbar equivalent network for switching a data stream 1106 from an ingress stage 1110 through a center stage 1120 and to an egress stage 1130. The switching network 1050 can be a Clos network, a Benes network, a multi-stage network, or a similar crossbar equivalent network.

The switching network 1050 can include the ingress stage 1110 having ingress nodes 1112 with ingress stage input ports 1114 and ingress stage output ports 1116. The ingress nodes 1112 can be implemented with the switch blocks 930 of FIG. 9.

The switching network 1050 can include the center stage 1120 having center nodes 1122 with center stage input ports 1124 and center stage output ports 1126. The center nodes 1122 can be implemented with the switch blocks 930.

The switching network 1050 can include the egress stage 1130 having egress nodes 1132 with egress stage input ports 1134 and egress stage output ports 1136. The egress nodes 1132 can be implemented with the switch blocks 930.

The switching network 1050 can receive the data stream 1106 in one of the ingress stage input ports 1114 and route the data stream 1106 to one of the center nodes 1122. The data stream 1106 can include the virtual bus 722 of FIG. 7, a data plane data connection, a control plane data connection, or a combination thereof.

The center nodes 1122 can route the data stream 1106 to one of the egress nodes 1132. The egress nodes 1132 can switch the data to one of the egress stage output ports 1136 and to the data destinations 908. The data destinations 908 can include the application fragments 902 of FIG. 9.

The switch complex 1002 includes the switching network 1050 managed by the control plane 922 of FIG. 9. The switching network 1050 can include three interconnected stages of the switch blocks 930 of FIG. 9. Each of the switch blocks 930 is a switching element that can act as a crossbar equivalent network capable of switching any of n inputs to any of m outputs.

For example, there can be (r-n×m) of the switch blocks 930 on the ingress stage 1110, (m-r×r) of the switch blocks 930 in the center stage 1120, and (r-m×n) of the switch blocks 930 in the egress stage 1130. If m>2r-1, then the overall multi-stage switch is non-blocking. Non-blocking is the condition where all inputs can be routed to all outputs without contention of any intermediate node. In another example, the switching network 1050 can include 6 of the ingress nodes 1112, 6 of the egress nodes 1132, and 10 of the center nodes 1122.

The switching network 1050 can be a three-stage switch that is rearrangeable and can supports packing. The condition for rearrangeability is m>=r. Rearrangeability is defined as the capacity for moving existing connections when necessary to avoid blocking upon request for a connection.

Packing is defined as the procedure that favors connections through the most-used portion of the network, saving the least-used part of the network as last choice. The assertion of an action to rearrange the connections of the routing network 1050 using a packing procedure can apply to multicast switches, provided the switching network 1050 has an equivalent number of input and output ports. Multicast application of such a Clos interconnect implies that the switching network 1050 can include idle instances of the input ports.

Packing consolidates the routing of the data connections 912 through the fewest number of the center nodes 1122. Packing can form new instances of the data connections 912 in the center nodes 1122 having available capacity or in an unused instances of one of the center nodes 1122. Repacking is defined as detecting when an existing instance of the data connections 912 has terminated and the switching network 1050 can be reconfigured to arrange the data connections 912 according to the packing criteria.

The switching network 1050 can be a generalization of the Clos network, but since routing is always guaranteed on a Clos network, no packing or repacking is ever required and routing has a deterministic nature in time. The tradeoff is space versus time. The Clos network uses crosspoints more efficiently but at the cost of routing calculation time.

The switching network 1050 can be controlled by the switch control 1020 of FIG. 10. The switch control 1020 can be used to distribute switching information to each stage of the switching network 1050. The switching network 1050 can have the data connections 912 routing from the ingress stage 1110 through a center switching node 1140 to the egress stage 1130. The center switch node 1140 switches the data connection 912 from the ingress stage 1110 to the egress stage 1130.

Figure 12:
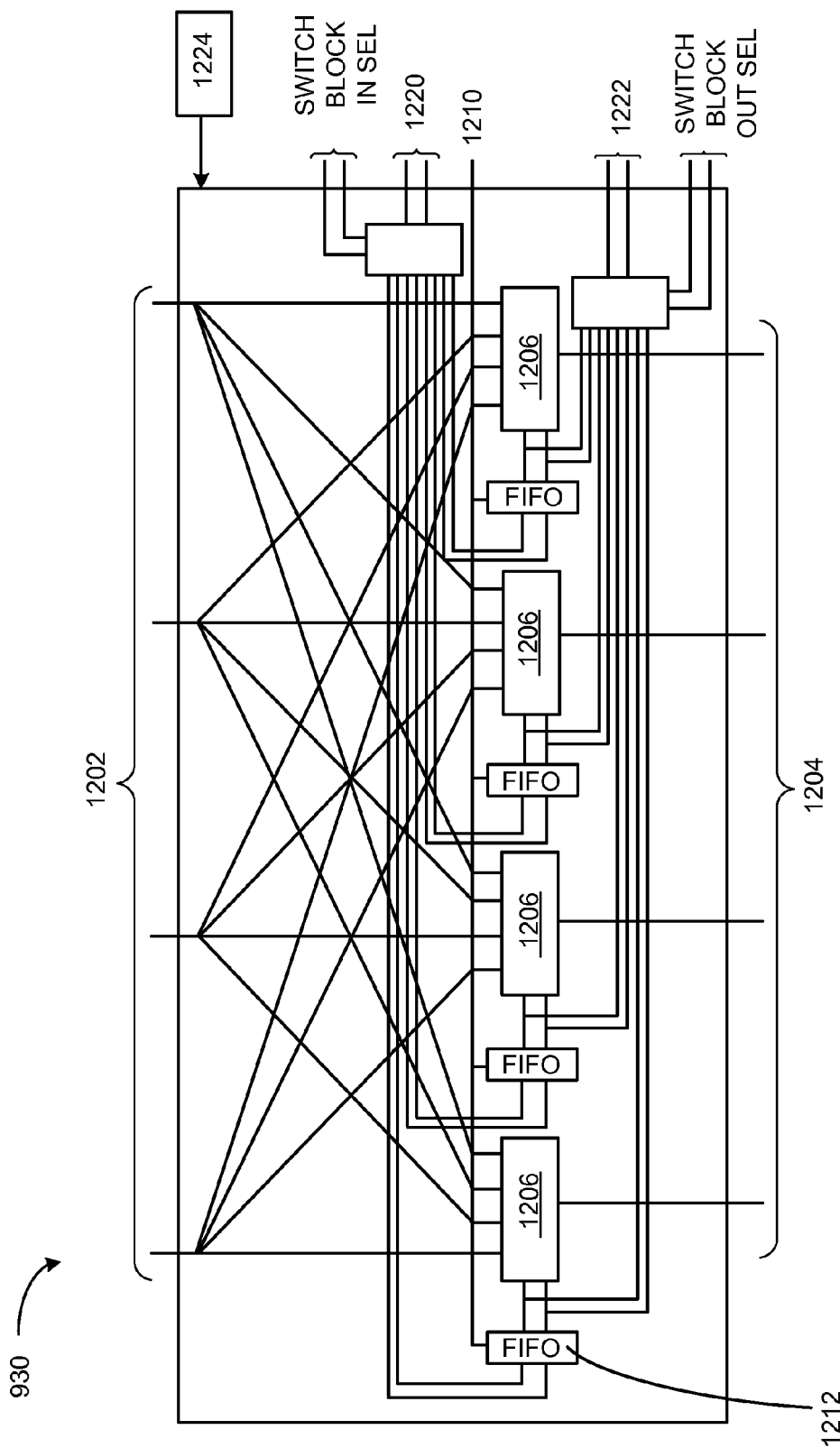
FIG. 12 is an exemplary block diagram of one of the switch blocks.

Referring now to FIG. 12, therein is shown an exemplary block diagram of one of the switch blocks 930. The switching network 1050 of FIG. 10 includes multiple stages of the switch blocks 930.

The switch blocks 930 are switching elements that implement a non-blocking crossbar equivalent switch that can route switch block input ports 1202 to switch block output ports 1204. The switch blocks 930 can include the switch block input ports 1202 for receiving data and the switch block output ports 1204 for sending data. The number of the switch block input ports 1202 and the switch block output ports 1204 indicate the size of one of the switch blocks 930. The size of one of the switch blocks 930 indicates the number of the data connections 912 of FIG. 9 that can traverse one of the switch blocks 930 at one time.

The switch blocks 930 can route data from any of the switch block input ports 1202 to any of the switch block output ports 1204 based on the configuration of a select in input 1220 and a select out input 1222. The select in input 1220 can select the switch block input ports 1202 to be routed to the instance of the switch block output ports 1204 indicated by the select out input 1222.

The switch blocks 930 can include an array of data selectors 1206 to select one of the switch block input ports 1202 with latched selection control to hold the input data value selected. The data selectors 1206 can select one of the switch block input ports 1202 and send the data value to the switch block output ports 1204. The connection state of the switch blocks 930 can be observed and set. For example, one of the switch blocks 930 can include a 4×4 configuration with four of the switch block input ports 1202 and four of the switch block output ports 1204.

The switch blocks 930 can include FIFO buffers 1212 connected to the data selectors 1206 to enable multiplexing of the switch blocks 930. For example, the switch blocks 930 can include a LATCH ENABLE control 1210 to control the output of the data selectors 1206. The LATCH ENABLE control 1210 can be a bus of signals, with each connected to one of the FIFO buffers 1212.

The FIFO buffers 1212 can have two fields. The first position contains the active bit, which indicates whether or not the associated one of the switch block output ports 1204 on the interesting schedule plane is active. The remaining bits can include a binary-coded representation of the selected one of the switch block input ports 1202.

The switch blocks 930 can receive control and configuration information from the control plane 922 of FIG. 9. The control plane 922 can be implemented in a dedicated or multiplexed configuration.

The switch blocks 930 can implement a switch map 1224. The switch map 1224 is the mapping of the switch block input ports 1202 to the switch block output ports 1204. The switch blocks 930 can be dynamically formed within the reconfigurable hardware devices 202 of FIG. 2 to provide sufficient switching capacity for the application 304 of FIG. 3.

It has been discovered that the switch blocks 930 can increase system functionality by forming the switch blocks 930 within the reconfigurable hardware devices 202 based on the demand for switching capacity for the application 304. Dynamically increasing the switching capacity of the computing system 100 of FIG. 1 supports the implementation of data intensive instances of the application 304.

Figure 13:
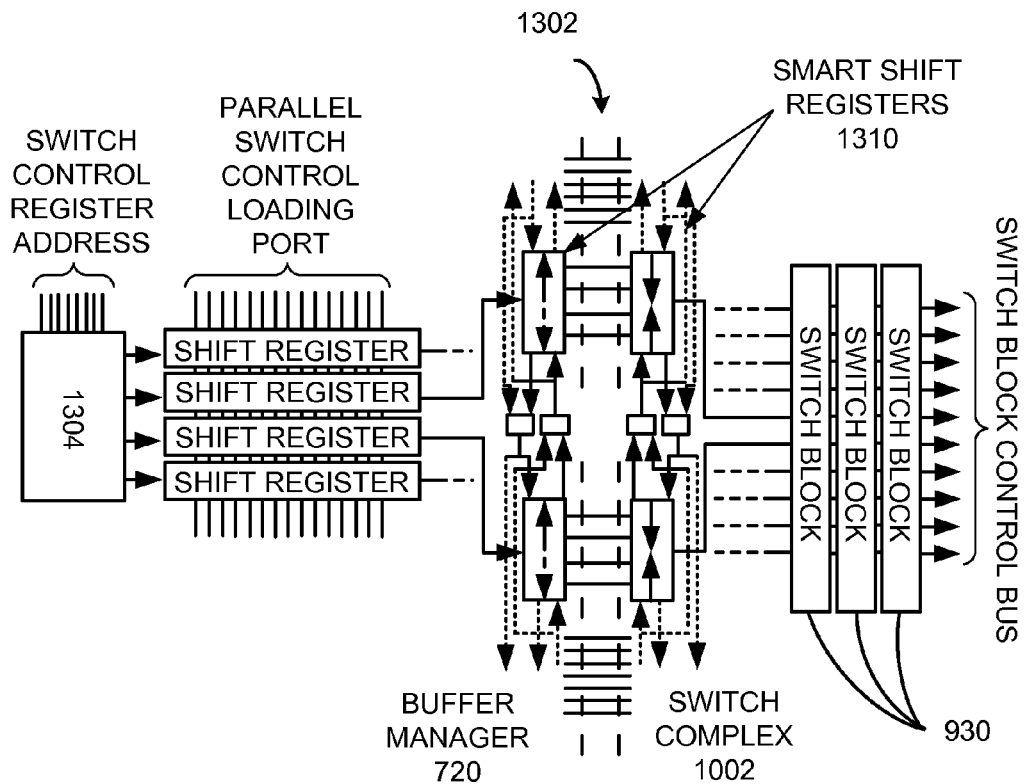
FIG. 13 is an exemplary block diagram of a switch control interface

Referring now to FIG. 13, therein is shown an exemplary block diagram of a switch control interface 1302. The switch control interface 1302 is for transferring control information from the buffer manager 720 to the switch complex 1002, including the switching network 1050 of FIG. 10.

The switch control interface 1302 is the connection between the buffer manager 720 and the switching network 1050. The switch control interface 1302 can include three corresponding segments of smart shift registers 1310 on the side of the buffer manager 720 and the switch side. Each of the smart shift registers 1310 can funnel commands to one of the three stages of the switching network 1050.

The buffer manager 720 can include a latch enable decoder unit 1304 for receiving the switch control register address. The buffer manager can include a set of shift registers for receiving the switch control information in parallel.

The switch control interface 1302 can act as a single multi-segment shift register. The smart shift registers 1310 can route command traffic from a port on the command buffer side to the corresponding port on the switching network side.

The switch control interface 1302 can be configured to operate in different modes. For example, the smart shift registers 1310 can operate in a chained mode and be configured to recognize command information any other stage and route the command information to the other stages accordingly. In another example, the smart shift registers 1310 can route the command information to a dedicated stage of the switching network 1050.

The switch control interface 1302 fans into the buffer manager 720 and the switch control interface 1302 to limit the number of clocks that are required to distribute the control lines to the available instances of the switch blocks 930. The smart shift registers 1310 extend in a chain in either direction on both sides of the switch and the buffer manager interface and forms a data loop.

Since the injection points are hard-wired, one has to be able to get outside of the smart shift register section injection site, in case all the buffer manager switch interface leads are consumed by application traffic. A bypass path around sections of the smart shift register allows faster transit to the ultimate destination, either on the distribution or on the collection side of the interface. The bypass path is also useful for skipping sections that are completely consumed by application traffic.

Figure 14:
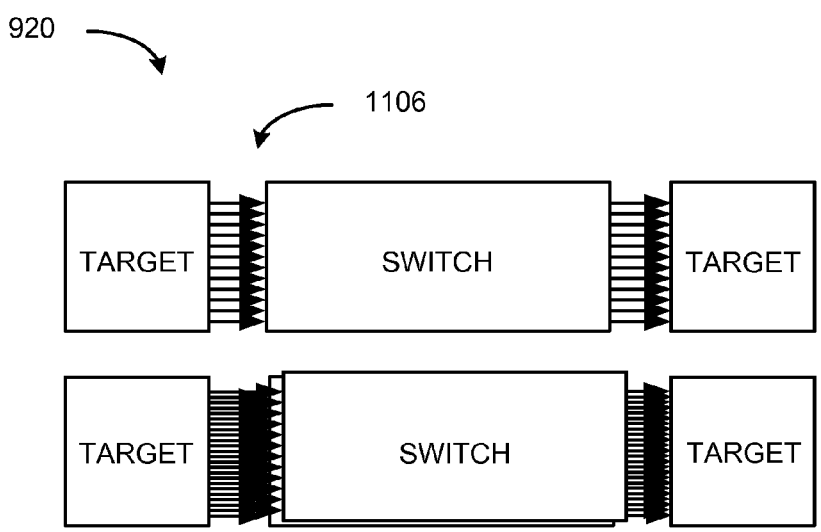
FIG. 14 is an example of the data plane.

Referring now to FIG. 14, therein is shown an example of the data plane 920. The data plane 920 can be implemented in a variety of ways. To increase the effective number of switch block input ports 1202 of FIG. 12 and switch block output ports 1204 of FIG. 12 available for the application 304 of FIG. 3, the data plane 920 can be implemented in a bit-slice configuration. For example, a flat, or non-bit sliced instance of the data plane 920 can be implemented where the targets are directly attached to the switch fabric, without the involvement of multiplexing.

Targets can represent the sources of data, sinks of data, or a combination thereof. In another example, a parallel instance of the data plane 920 can be implemented where multiple signal paths are multiplexed onto a single physical device pin.

It has been discovered that the computing system 100 of FIG. 1 offers increased connectivity by implementing the data plane 920 using a bit-slice configuration to effectively increase the number of switch ports available. Multiplexing multiple instances of the switch blocks 930 of FIG. 9 can increase the level of switching connectivity available for switching the data stream 1106.

When the bit-sliced approach is used, multiple signals are multiplexed onto a single port. To compensate for lost bandwidth for a single signal stream, the multiple parallel instances of the data plane 920 can be used to multiply the throughput per effective signal path.

Multiplexing can provide increased connectivity by representing two connections on a single port. Multiplexing the ports increases the connectivity of the single bit plane by a factor represented by the multiplex rate. For a given clock rate, multiplexing slows the per-signal throughput. Multiplying the number of bit-sliced instances of the data plane 920 can restore the overall per-signal throughput, as described above.

Bit-slicing the data plane 920 allows the number of ports to grow beyond an integrated circuit package pin limitation, at the cost of agility. For example, when employing only one bit plane, signaling can be stopped on a bit boundary. When employing n-bit planes, the granularity is limited to n-bit boundaries. The system design can account for transfer of more than one bit at a time across the boundary between the switch and the target. Additional transit delay can be incurred by multiplexing and de-multiplexing.

It has been discovered that the computing system 100 provides increased functionality and reduced switching time by multiplexing the data plane 920 by using multiple instances of the switch blocks 930. Supporting time multiplexing of the data plane 920 as well as multiple physical switching units allows the computing system 100 can to process more data in a shorter period of time.

Figure 15:
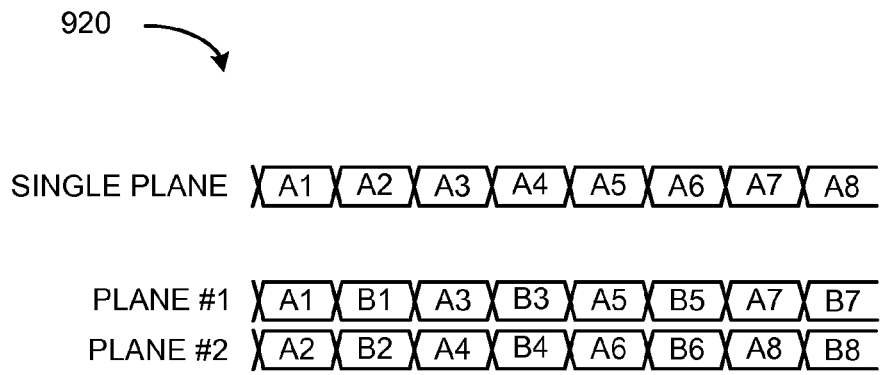
FIG. 15 is an example of the data plane in a multiplexed configuration.

Referring now to FIG. 15, therein is shown an example of the data plane 920 in a multiplexed configuration. The data plane 920 can increase the number of signal paths carried by implementing a bit-sliced configuration. When a bit-slicing approach is used, multiple signals are multiplexed onto a single signal path of the data plane 920. To compensate for lost bandwidth for a single signal stream, the multiple parallel instances of the data plane 920 can multiply the throughput per effective signal path.

For example, the "A" signal path bandwidth is the same over time. In the single plan configuration, eight bits of the "A" signal path data are transported for eight clock cycles. In two plane configuration, eight instances of the "A" signal path and eight instances of a "B" signal also both successfully transported in the same eight clock cycles.

Multiplexing can provide increased connectivity by representing two connections on a single port. Multiplexing the ports increases the connectivity of the single bit plane by a factor represented by the multiplex rate. For a given clock rate, multiplexing slows the per-signal throughput. Multiplying the number of bit-sliced instances of the data plane 920 can restore the overall per-signal throughput, as described above.

Bit-slicing the data plane 920 allows the number of ports to grow beyond an integrated circuit package pin limitation, at the cost of agility. For example, when employing only one bit plane, signaling can be stopped on a bit boundary. When employing n-bit planes, the granularity is limited to n-bit boundaries. The system design can account for transfer of more than one bit at a time across the boundary between the switch and the target. Additional transit delay can be incurred by multiplexing and de-multiplexing.

Figure 16:
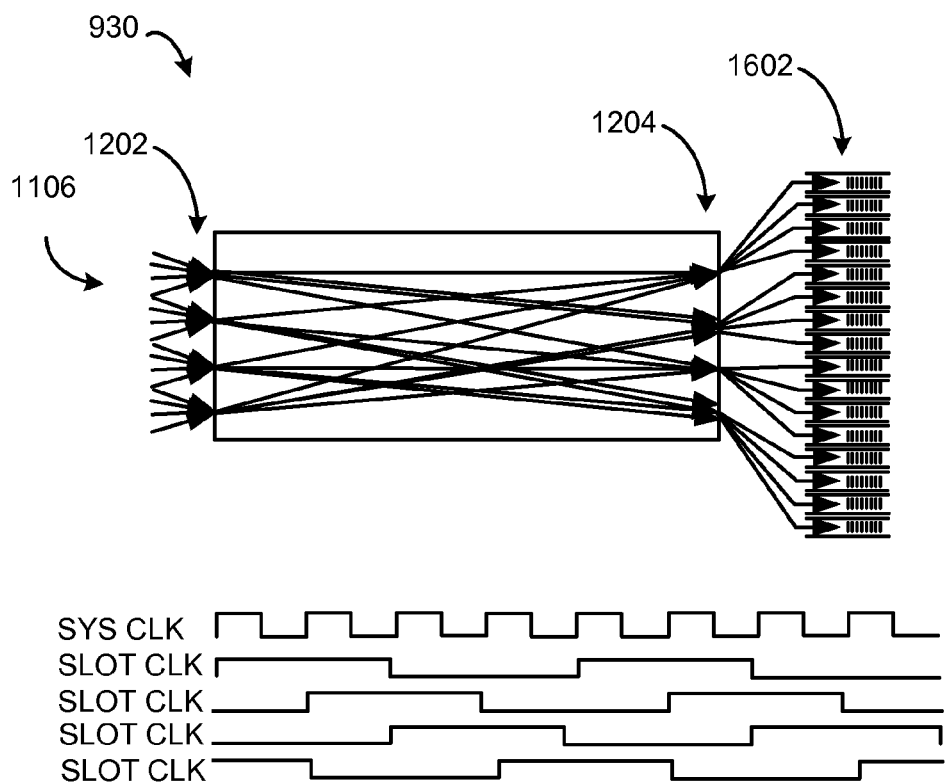
FIG. 16 is an example of a four-way output port schedule.

Referring now to FIG. 16, therein is shown an example of a four-way output port schedule 1602. The switch blocks 930 can receive the data stream 1106 on the switch block input ports 1202 and route the data stream 1106 to one of the switch block output ports 1204. The data stream 1106 can multiplex multiple instances of the data stream 1106 on a single path through the switch blocks 930.

Multiplexing the switch block output ports 1204 can require scheduling, since any phase of the overall schedule is independently completely connected. For example, any of the switch block input ports 1202 can be routed to any of the switch block output ports 1204.

Each scheduled instance of the connection plane within the physical instance of the switch plane can service a different set of the inbound instances of the data stream 1106 and a different set of terminating queues. The inbound flows can include the virtual bus 722 of FIG. 7. The connection plane can be a portion of the data plane 920 of FIG. 9.

Each of the scheduled instances of the connection plane can have a virtual clock. For example, the virtual clock for a four-way multiplexer can operate at one-quarter the rate of the system clock. The rate will be inversely proportional to the degree of multiplexing. If there were five schedule slots, then the clock for each flow would be one-fifth the rate of the system clock. All slot clocks can be phased relative to each other.

Figure 17:
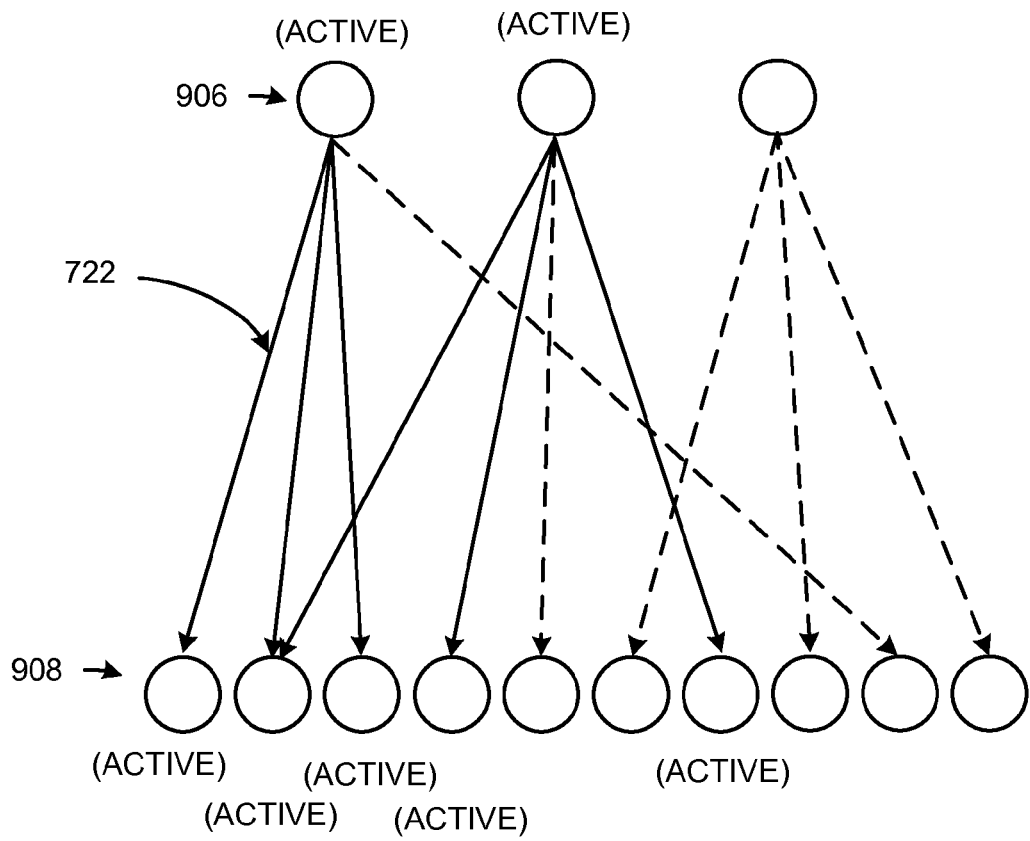
FIG. 17 is an example of the virtual bus.

Referring now to FIG. 17, therein is shown an example of the virtual bus 722. The virtual bus 722 is a data construct that synchronizes a collection of application data and signals via specialized flow control signals that belong to such a collection. The virtual bus 722 can exchange data between the data sources 906 and the data destinations 908. The virtual bus 722 is the set of data and control signals that are routed across the switching network 1050 of FIG. 10 from the data sources 906 to the data destinations 908.

The data sources 906 and data destinations 908 can include the application fragments 902 of FIG. 9, the signal buffers 916 of FIG. 9 in the memory devices 726 of FIG. 7, external interfaces, or a combination thereof. The signal buffers 916 can include signal instances stored in a buffer of the memory device 726.

In the bit-sliced configuration of the data plane 920 of FIG. 9, the virtual bus 722 can coordinates release of the signals as a wave across the set of the data sources 906. The virtual bus 722 can manages dissolution of the waves of signal instances as such signals become obsolete. For example, the data plane 920 can operate on the switching network 1050 having the data connections 912 of FIG. 9 flowing as a wave of individual data elements on different stages of the switching network 1050. If one of the data connections 912 is interrupted, then the data plane 920 can discard the data elements that are no longer needed.

The applications fragments 902 can implement flow control across the virtual bus 722 by subjecting data outputs to the backpressure inputs of the virtual bus 722 and withholding information from inputs for a variety of reasons. A relocatable logic environment can include the dynamic placement of any application signal, including the application flow control. Because flow control for the virtual bus 722 is time sensitive and any inserted interconnect adds latency to the virtual bus 722 transferring data from the data sources 906 to the data destinations 908, application flow control signals can be prioritized, such as being delivered using a dedicated signal path. The switching network 1050 of FIG. 10 and the switch complex 1002 of FIG. 10 can be used to implement the relocatable logic environment for the virtual bus 722.

For example, the data sources 906 fan out to data destinations 908. Not all of these signals are necessarily used by the consuming logic units. The signals could be input to a multiplexer that selects only one of these signals for downstream consumption.

In another example, if the signal transfers to active signal sinks are indicated with solid arrows. The dotted lines indicate connections to destinations that at the moment contribute nothing to the downstream result. If all of the links out of a source terminate on non-contributing destinations, that source can be suspended from activity as well at no effect to a downstream result.

Figure 18:
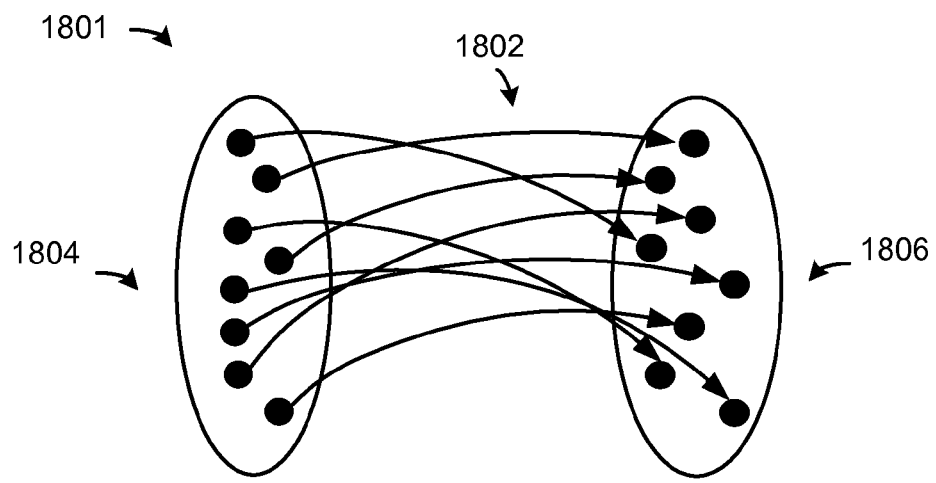
FIG. 18 is an example of a bipartite graph of the application.

Referring now to FIG. 18, therein is shown an example of a bipartite graph 1801 of the application 304 of FIG. 3. The bipartite graph 1801 can model a connection map 1802 for mapping of graph input ports 1804 to graph output ports 1806. The bipartite graph can map the data sources 906 of FIG. 9 and data destinations 908 of FIG. 9 for the application 304 having the application fragments 902 of FIG. 9.

The connection map 1802 can describe the mapping between the graph input ports 1804 and the graph output ports 1806 for a scheduling time slot. For example, the connection map 1802 can represent a mapping of the graph input ports 1804 to the graph output ports 1806 for a particular time interval.

Another of the connection map 1802 can represent a different mapping of the graph input ports 1804 to the graph output ports 1806 for a different time interval. In another example, the connection map 1802 can be described with a record format including connection ID, physical source port, physical output port A, physical output port B, and physical output port N, where N is the designator for the last enumerated fan-out on the node.

Referring now to FIG. 19, therein is shown an example of a connection matrix 1902. The connection matrix 1902 can represent the input-output mapping of a portion of the switching network 1050 of FIG. 10. The connection matrix 1902 can be a representation of the bipartite graph for the connection map 1802 of FIG. 18.

The rows in the connection matrix 1902 corresponds to input nodes in an input port partition. The input portion partition can represent the ingress stage input ports 1114 of FIG. 11. The columnar positions in the rows can represent the output nodes in an output port partition that are candidates for connection to the respective one of the input nodes. The input nodes can represent one of the egress stage output ports 1136 of FIG. 11.

The rows in the connection matrix 1902 can be connection vectors 1908. Each one of the connection vectors 1908 can map one of the input nodes to one of the output nodes. The connection matrix 1902 represents a bipartite graph having each of the input nodes mapped to only a single one of the output nodes. The connection vectors 1908 can include values of zero for all columns except for the selected one of the output nodes. For example, if the second row of the connection matrix 1902 has a value of one in column six, then the second one of the input nodes should be routed to the sixth one of the output nodes.

Referring now to FIG. 20, therein is shown an example of a streamlined matrix 2002. For example, the streamlined matrix 2002, such as a condensed matrix, can represent the mapping of the ingress nodes 1112 of FIG. 11 to the egress nodes 1132 of FIG. 11 of the switching network 1050 of FIG. 10.

The connection matrix 1902 can be used to guide switching operations in a variety of ways. For example, one process includes the mapping the input ports and the output ports using partitions. The partitions can represent mapping partitions 2004. Each of the mapping partitions 2004 can represent a block of ports. The ports can represent the ingress stage input ports 1114 of FIG. 11, the egress stage output ports 1136 of FIG. 11, or a combination thereof. One of the mapping partitions 2004 can represent one of the switch blocks 930 of FIG. 9.

In another example, the rows and the columns of the connection matrix 1902 of a switch can be mapped onto a streamlined instance of the connection matrix 1902. The switching network 1050 can be mapped onto the streamlined matrix 2002. The streamlined matrix 2002 can map from one of the mapping partitions to another of the mapping partitions.

The bits represented in each dotted-line box of the mapping partition 2004 in the connection matrix 1902 can be logically OR'd together to generate a partition level streamlined instance of the connection matrix 1902. The process can include:
1. n≡size of partition
2. N≡number of nodes in each bipartite set
3. O≡original connection matrix
4. T≡transformed connection matrix
5. Transform $T_{a,b}$ as:

$$T(a,b) = \begin{matrix} 0_{an,bn} + O_{an,bn+1} + \ldots + O_{an,bn+n-1} + \\ 0_{an+1,bn} + O_{an+1,bn+1} + \ldots + O_{an+1,bn+n-1} \\ \vdots \\ +0_{an+n-1,bn} + O_{an+n-1,bn+1} + \ldots + O_{an+n-1,bn+n-1} \end{matrix} \quad (1)$$

The partitions apply to the switch inputs and outputs. The transformation $T_{a,b}$ projects the input ports onto input port partitions and the matrix output ports onto the output port partitions. The center stage 1120 of FIG. 11 of the switching network 1050 can be used for reconciling switching conflicts from the ingress stage 1110 of FIG. 11 to the egress stage 1130 of FIG. 11.

For example, if two of the input ports attached to a single one of the switch blocks 930 of FIG. 9 of the ingress stage 1110 both seek a pair of the output ports on the same one of the switch blocks 930 of the egress stage 1130, then there can be a potential routing conflict. The center stage 1120 can be used to resolve the conflict by providing multiple routes from one of the switch blocks 930 on the ingress stage 1110 to one of the switch blocks 930 on the egress stage 1130. In a further example, two separate links route the two connections through two different instances of the switch blocks 930 of the center stage 1120.

There can be only one link through one of the center nodes 1122 of FIG. 11 between any pair of the ingress nodes 1112 and egress nodes 1132. In order for there to be a link through a given center stage switch block from an input switch block to an output switch block, there must be an available link from one of the input instance of the switch blocks 930 to the center nodes 1122, and an available link from one of the switch blocks 930 of the center stage 1120 to one of the output instances of the switch blocks 930.

Referring now to FIG. 21, therein is shown an example of a color matrix 2102. The color matrix 2102 is a mapping of the input port partitions to the output port partitions of a Benes network. For example, the input port partitions can be represented by the mapping partitions 2004 of FIG. 20.

The color matrix 2102 can be an example of the connection matrix 1902 of FIG. 19. The color matrix 2102 can indicate the mapping of one of the ingress nodes 1112 of FIG. 11 to one of the egress nodes 1132 of FIG. 11 through one of the center nodes 1122 of FIG. 11, where the center nodes 1122 are represented by color names.

The different edges incident upon a node in the bipartite graph of the connection map 1802 of FIG. 18 can be assigned different colors, which will differentiate groups of disjoint nodes. The disjoint node pairs share neither source node nor destination node. A group of disjoint node pairs can be routed through a single one of the center nodes 1122.

The rows of the color matrix 2102 represent the input port partitions of the switching network 1050 of FIG. 10 and the columns refer to the output port partitions of the switching network 1050. Each color can represent one of the center nodes 1122 of the switching network 1050.

Based on graph coloring and graph labeling, the edges or nodes of a graph can be identified by color. Colors may not repeat themselves across either rows or columns. Once colors have been assigned, the source and destination pairs are grouped by color and like-colored pairs can be assigned to a single one of the switch blocks 930 of FIG. 9 of the center stage 1120 of FIG. 11. All such pairs must be disjoint based on the coloring algorithm.

More than one of the input port partitions can seek the same instance of the output port partitions. The repack solution must be prepared to reserve more than one color per partition. For example, the partition size can represent a single port or a group of all of the input ports on an ingress stage switch block.

Figure 22:
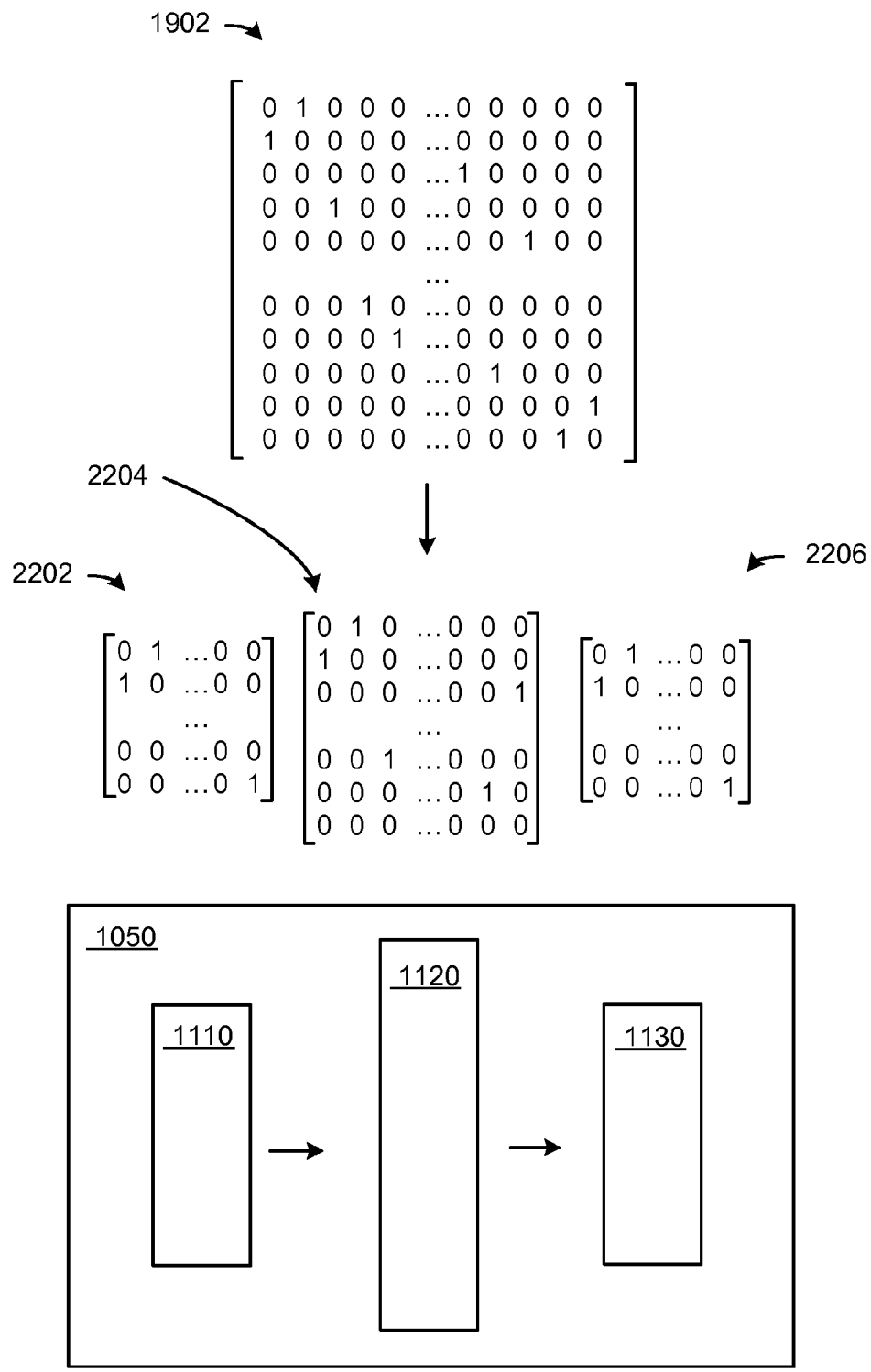
FIG. 22 is an example of partitioning the connection matrix.

Referring now to FIG. 22, therein is shown an example of partitioning the connection matrix 1902. The connection matrix 1902 can be separated into portions for each of the stages of the switching network 1050 including an ingress portion 2202, a center portion 2204, and an egress portion 2206. Each portion can provide switching information for one of the stages of the switching network 1050.

The ingress portion 2202 can be deployed to the ingress stage 1110. Deploying is defined as activating a portion of the switching information in a stage of the switching network 1050. Once the routing information has been broadcast and distributed to a stage of the switching network 1050, the portion of the switching information can be deployed in the stage, and the switching network 1050 can be reconfigured to implement the routing information. For example, the switching information for each stage can be broadcast simultaneously to the nodes of each stage of the switching network 1050.

The center portion 2204 can be deployed to the center stage 1120. The egress portion 2206 can be deployed to the egress stage 1130.

The connection matrix 1902 can represent different portions of the switching network 1050. For example, the connection matrix 1902 can include the ingress portion 2202 that provides routing information for the ingress nodes 1112 of FIG. 11 of the switching network 1050. The connection matrix 1902 can include the center portion 2204 that provides routing information for the center stage of the switching network 1050. The connection matrix 1902 can include the egress portion 2206 that provides routing information for the egress nodes 1132 of FIG. 11 of the switching network 1050.

Reconfiguring the switching network 1050 is changing the switching configuration of the switch blocks 930 of FIG. 9 for each stage of the switching network 1050. For example, the switch blocks 930 can be reconfigured to map the switch block input ports 1202 of FIG. 12 to the switch block output ports 1204 of FIG. 12 for each stage of the switching network 1050 based on the portion of the switching information for each stage. The switching network 1050 is reconfigured to reassign the data connections 912 of FIG. 9 being switched across the switching network 1050.

Reconfiguration can be performed without impacting the flow of data from the data connections 912 by deploying the switching information on a stage by stage basis synchronously with the transit of the data of the data connections 912. For example, when the data from the data connections 912 flows from one of the ingress nodes 1112 to one of the center nodes 1122 of FIG. 11, the ingress portion 1132 of the configuration information can be deployed to the ingress nodes 1112 of the ingress stage 1110.

Figure 23:
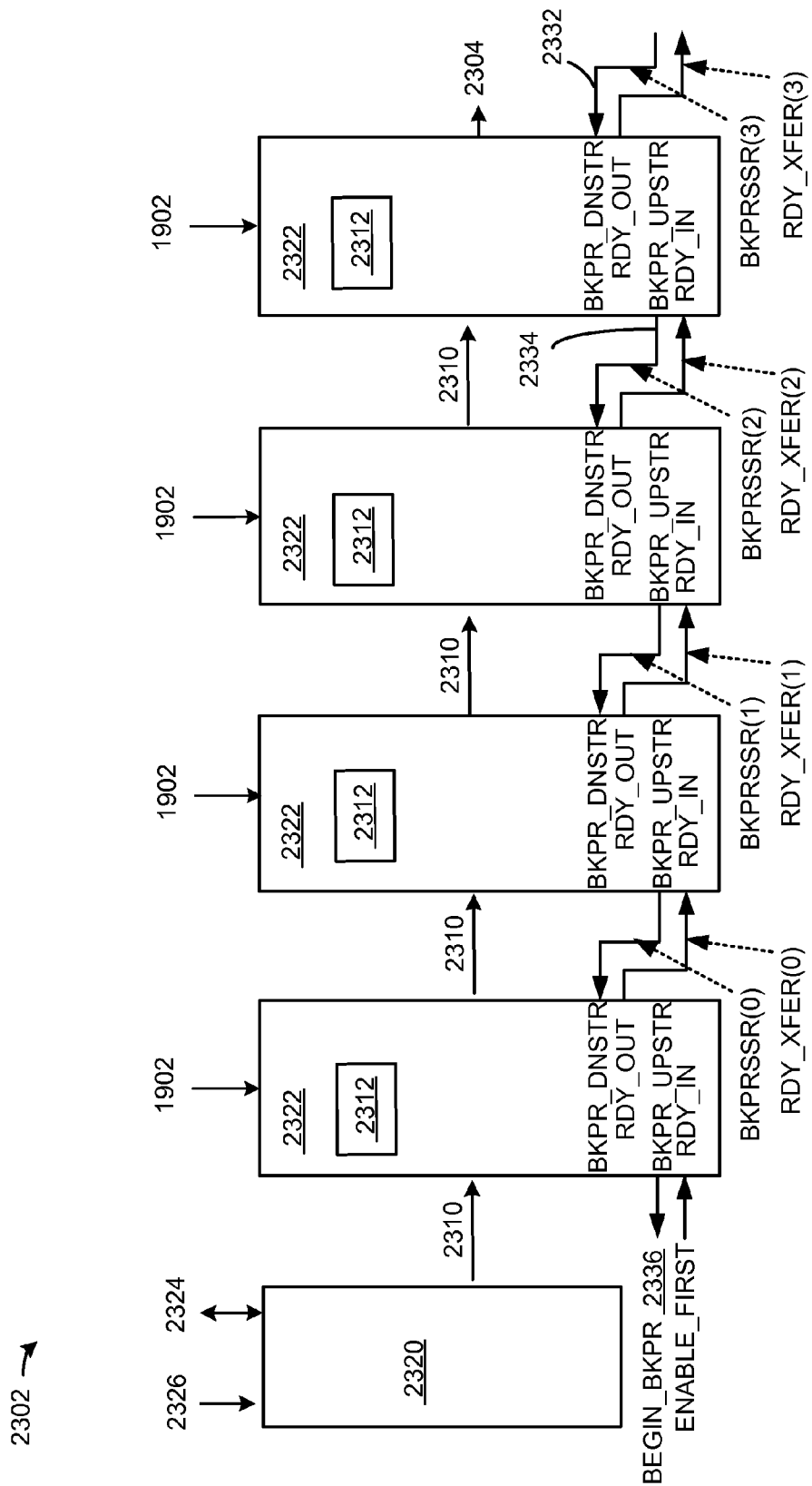
FIG. 23 is an example of a loosely coupled packing pipeline.

Referring now to FIG. 23, therein is shown an example of a loosely coupled packing pipeline 2302. The loosely coupled packing pipeline 2302 can calculate a repacking route 2304 based on the connection matrix 1902 of FIG. 19 for the switching network 1050 of FIG. 10. The repacking route 2304 is the configuration information for the switch blocks 930 of FIG. 9 of the switching network 1050 to implement the connection matrix 1902.

The loosely coupled packing pipeline 2302 is a hardware structure having multiple stages to receive portions of the connection matrix 1902 and can calculate the repacking route 2304 through one of the center nodes 1122 of FIG. 11. The loosely coupled packing pipeline 2302 is loosely coupled because different portions of the connection matrix 1902 can be received and used to generate different portions of the repacking route 2304.

The loosely coupled packing pipeline 2302 can include a chained pipeline with upstream and downstream feedback to asynchronously manage the flow of data. The loosely coupled packing pipeline 2302 includes a chain of complex processing elements. The processing elements can include color selection blocks 2322 that can route through a set of colors representing the center nodes 1122 and recycle back to the first color when the last color is allocated.

Each of the color selection blocks 2322 can maintain resident vertical color vectors 2312 for multiple destination ports. The resident vertical color vectors 2312 is information representing one of the center nodes 1122 for each of the destination ports, where the center nodes 1122 are designated by a separate color. The resident vertical color vectors 2312 can indicate which of the center nodes 1122 have been allocated for routing in an instance of the repacking route 2304. For example, the resident vertical color vectors 2312 can represent the mapping of one of the center nodes 1122 to one of the egress stage output ports 1136 of FIG. 11 of one of the egress nodes 1130 of FIG. 11.

The loosely coupled packing pipeline 2302 is a multi-stage structure including an input select logic unit 2320, a set of the color selection blocks 2322 connected serially in a pipelined configuration, and associated control logic. The loosely coupled packing pipeline 2302 can receive the connection matrix 1902 defining the source and destination configuration for one of the switch blocks 930 and calculate the repacking route 2304.

The repacking route 2304 is switching information used to configure the switching network 1050 to switch the data connections 912 of FIG. 9 from the data source 906 of FIG. 9 to the data destination 908 of FIG. 9. The repacking route 2304 can include configuration information for the switch blocks 930 of FIG. 9 to indicate the mapping of the switch block input ports 1202 of FIG. 12 to the switch block output ports 1204 of FIG. 12. The repacking route 2304 can include configuration information for the select in input 1220 of FIG. 12 and the select out input 1222 of FIG. 12 for each of the switch blocks 930.

The repacking route 2304 can be calculated using the packing procedure to consolidate the data connections 912 through the fewest number of the center nodes 1122 of FIG. 11. The repacking route 2304 can be calculated during a repacking operation after one of the data connections 912 has been terminated. The termination of one of the data connections 912 can be detected if the termination status 914 of FIG. 9 indicates termination.

The color selection blocks 2322 can process portions of the connection matrix 1902 to determine the center nodes 1122 to be used to route the ingress stage input ports 1114 of FIG. 11 to the egress stage output ports 1136. The input select logic unit 2320 searches a condensed version of the connection vectors and skips the instances of the input ports that are idle. A condensation transform can be applied to the connection vectors 1908 of FIG. 19 by performing a logical OR operation of the one entire instance of the connection vectors 1908 for each of the input ports.

A port activity vector 2326 is a data structure to indicate which input ports are active. A port activity mask vector 2324 is a data structure to indicate which input ports have already been treated by the loosely coupled packing pipeline 2302. The connection vectors 1908 describing the connectivity of the active instances of the input ports in an instance of the switch blocks 930 can be presented a block at a time to each element of the loosely coupled packing pipeline 2302 synchronous to arrival of horizontal color vectors 2310. The horizontal color vectors 2310 can represent the assignment of the center nodes 1122 to one of the input ports.

For example, at the start of the repack cycle, one of the horizontal color vectors 2310 is reset to all logical zeros. As center stage routing is resolved for each connection, colors are added to the instance of the horizontal color vectors 2310 as it passes from element to element in the loosely coupled packing pipeline 2302. When a horizontal vector for a particular input switch block has cleared the pipeline, it is eligible for recycling. When recycled, the next block of input ports from the associated input switch block are bundled for processing with the in-progress color vector.

The pipeline dependencies are managed by rotating pipeline data submissions among switch blocks. For instance, the data submissions are grouped so that the pipeline processes mutually exclusive groups of input ports simultaneously at each respective pipeline stage. When the processing of a given input group completes and the instance of the horizontal color vectors 2310 passes out the end of the pipeline, this input group becomes again eligible for further processing. The resulting instance of the horizontal color vectors 2310 can be part of the repacking route 2304.

The loosely coupled packing pipeline 2302 can provide asynchronous flow control between the color selection blocks 2322 with backpressure signals propagating from downstream stages of the pipeline to the beginning of the pipeline. For example, the loosely coupled packing pipeline 2302 can include each of the color selection blocks 2322 having a BKPR_DNSTR input 2332 for receiving the backpressure information from a BKPR_UPSTR output 2334 of the downstream instance of the color selection blocks 2322. The first stage of the loosely coupled packing pipeline 2302 can provide a BEGIN_BKPR output 2336 for sending the final backpressure signals to other modules.

The asynchronous flow control can support variable amounts of processing time required to process each portion of the connection matrix 1902. Some of the color selection blocks 2322 can require additional time to process contention. For example, if one of the color selection blocks 2322 is processing four simultaneous inputs, then four different center nodes 1122 must be assigned. Each portion of the connection matrix 1902 being processed can be from the same instance of the ingress nodes 1112 of FIG. 11.

The loosely coupled packing pipeline 2302 is populated at all stages with portions of the connection matrix 1902 for different instances of the ingress nodes 1112. The input select logic unit 2320 can filter out the unconnected input ports to increase performance. The port activity vector 2326 can be received by the input select logic unit 2320 and masked with the port activity mask vector 2324 and then a set of ports are selected equal in number to the width of the upstream instance of the horizontal color vectors 2310.

The connection vector segments appropriate to the input ports thus selected are packed and presented to one of the color selection blocks 2322, synchronous to the arrival of one of the horizontal color vectors 2310 for these inputs. When a memory is used to hold the connection vectors, data retrieval is intelligently synchronized with overall pipeline schedule. The pipeline dispatches the address appropriate to the presented block of input instances of the horizontal color vectors 2310, which maps to the input ports processed by the associated pipeline block.

Each of the color selection blocks 2322 picks up different output switch blocks, so the instance of the connection vectors 1908 is partitioned according to the responsibilities of each pipeline stage. Synchronization can be achieved by identifying the input switch block under treatment when presenting one of the horizontal color vectors 2310 to a pipeline stage. This information is generated by the input select logic unit 2320 and passed down the pipeline together with the horizontal color vector.

In the interests of conserving logic resources at the sacrifice of performance, the loosely coupled packing pipeline 2302 can process subsets of the input ports for a given instance of the ingress stage switch block. Subsequent groups of input port information belonging to a given ingress stage must wait for the current group of input ports to complete processing through the pipeline. The horizontal color vectors 2310 can then be recouped at the output of the loosely-packed pipeline and recycled for effective use by the next group of input ports.

When a number of input ports less than the width of Upstream Horizontal Color Vector remain to be processed, the feeding connection vectors must be buffered with zeros, which will contribute nothing to the overall result.

It has been discovered that the computing system 100 of FIG. 1 provides increased speed of routing by partitioning the connection matrix 1902 based on the number of inputs and outputs of the switch blocks 930. Reducing the size of the connection matrix 1902 reduces the amount of processing needed to determine the repacking route 2304.

It has been discovered that the computing system 100 prevents blocking of connections in the switching network by populating the loosely coupled packing pipeline 2302 with portions of the connection matrix 1902 representing different instances of the ingress nodes 1112. Processing different ingress nodes 1112 avoids dependencies and prevents blocking and contention of the center nodes 1122. Preventing blocking reduces the amount of control flow signaling required to calculate the repacking route 2304.

Figures 24, 25:
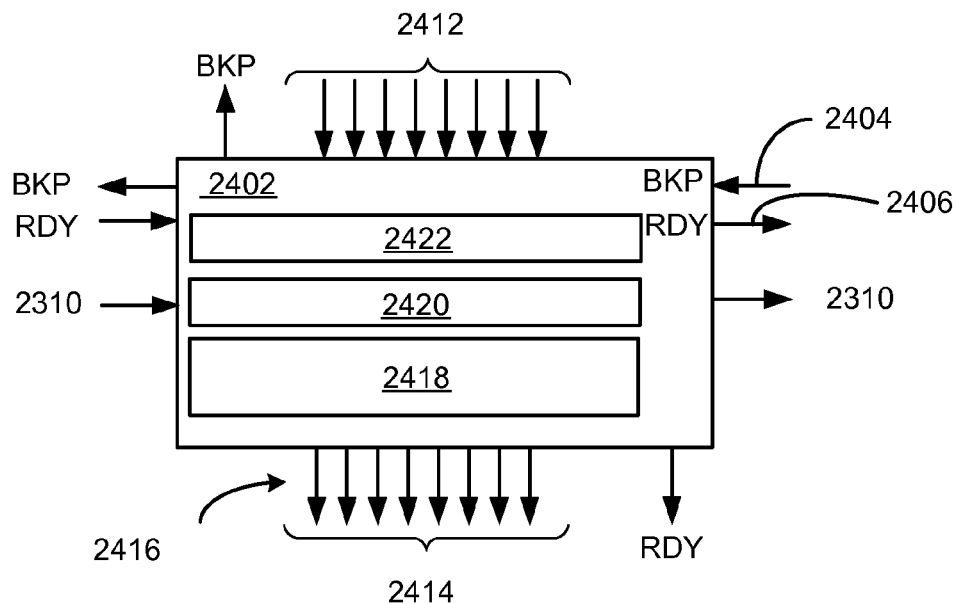
FIG. 24 is an example of a block diagram of packing pipeline elements of the loosely coupled packing pipeline.
FIG. 25 is an example of a pipeline schedule for the loosely coupled packing pipeline.

Referring now to FIG. 24, therein is shown an example of a block diagram of packing pipeline elements 2402 of the loosely coupled packing pipeline 2302 of FIG. 23. The loosely coupled packing pipeline 2302 includes a plurality of the packing pipeline elements 2402 and interconnecting flow control logic. The color selection blocks 2322 of FIG. 23 can be implemented with the packing pipeline elements 2402.

The packing pipeline elements 2402 are hardware modules for calculating a portion of the repacking route 2304 of FIG. 23 for the switching network 1050 of FIG. 10. The packing pipeline elements 2402 can receive the connection vectors 1908 of FIG. 19 for the connection matrix 1902 of FIG. 19, one of the horizontal color vectors 2310 representing the usage of the center nodes 1122 of FIG. 11, and flow control information. The flow control information can include a BKP backpressure input 2404, a RDY ready input 2406, or a combination thereof.

The packing pipeline elements 2402 can implement the loosely coupled packing pipeline 2302. The backpressure signals BKPR_UPSTR and BKPR_DNSTR are abbreviated to BKP and the ready signal RDY IN and RDY OUT can be abbreviated to RDY.

The BKP backpressure input 2404 and the RDY ready input 2406 can provide asynchronous flow control from upstream to downstream, as well as controlling the flow of the connection vectors 1908 into connection vector ports 2412 and a color choices matrix 2414 from a color choices port 2416. The asynchronous flow control approach enables smooth processing of a sparse instance of the connection matrix 1902 where the sub-matrices are passed into the connection vector ports 2412 in 8×8 portions of the connection matrix 1902.

For example, an 8×8 portion of the connection matrix 1902 can represent the compressed connection information from 8 input ports to 8 output switch blocks. Since the switch blocks 930 of FIG. 9 for the output can support multicast, references to individual instances of the output switch block ports are redundant from the point of view of the center stage, so compression of multicast information is allowed in this context.

The packing pipeline elements 2402 can include a vertical color register file unit 2418, a center stage resolution unit 2420, and a conflict resolution unit 2422. The vertical color register file unit 2418 can hold a record for the colors assigned to the output instance of the switch blocks 930 to represent the state of the vertical color assignment.

The center stage resolution unit 2420 can apply a logical XOR operation to the incoming instance of the horizontal color vectors 2310 with the resident vertical color vectors 2312 of FIG. 23 and creates an ordered list of eligible colors for each connection to be routed through. Each color represents a different center stage block. The list is created for alternatives in case other instances of the input ports submitted at the same time attempt to route through the same center stage switch block.

The conflict resolution unit 2422 can enable parallel submission of connection information pertaining to more than one input port. If competing connections resolve to the same center stage port, the conflict resolution unit 2422 will choose a winner and return the loser for a recycle attempt at center stage routing.

It has been discovered that the computing system 100 of FIG. 1 provides increased functionality and reduced hardware requirements by calculating the repacking route 2304 using the loosely coupled packing pipeline 2302. Sending portions of the connection matrix 1902 through the loosely coupled packing pipeline 2302 provides efficient usage of the packing pipeline elements 2402 and reduced wasted cycles.

Referring now to FIG. 25, therein is shown an example of a pipeline schedule 2502 for the loosely coupled packing pipeline 2302 of FIG. 23. The schedule for a four stage instance of the loosely coupled packing pipeline 2302 can indicate the progress of data through the loosely coupled packing pipeline 2302. The connectivity vector contribution notation $Cs_k,x$ has S≡input port block, k≡input block subgroup, and x≡output port block.

The horizontal color vectors 2310 of FIG. 23 are recycled and reused. For example, the horizontal colors represent the center nodes 1122 of FIG. 11, such as a center switching node, that are used for routing the ingress stage inputs to the egress stage outputs. The prime symbol with a color can indicate that one of the horizontal color vectors 2310 in use on one of the pipeline stage has been recycled. For example, the color represented by 1' indicates that the color represented by 1 has been recycled.

The schedule reflects a grouping of the connection matrix 1902 of FIG. 19. The connection matrix 1902 can subdivide the input ports by the rows and the destination ports by the columns. The loosely coupled packing pipeline 2302 can include the input port partitions on the boundaries of the switch block input ports 1202 of FIG. 12.

For example, if the ingress stage instances of the switch blocks 930 of FIG. 9 consist of 2×2 elements, then the first row describes the connection state for the switch block input ports 1202 that are connected to the first instance of the switch blocks 930 on the ingress stage 1110 of FIG. 11, the second row describes the connection state for the switch block input ports 1202 on the second instance of the switch blocks 930 of the ingress stage 1110, and so on.

The output ports are consolidated into output port groups, because the switch blocks 930 of the egress stage 1130 of FIG. 11 are multicast. Therefore, as long as a connection reaches a single instance of the switch block input ports 1202 to one of the switch blocks 930 of the egress stage 1130, then it can be broadcast to the switch block output ports 1204 of FIG. 12 on that instance of the switch blocks 930 of the egress stage 1130. The columns can represent groups of the output instances of the switch blocks 930.

For instance, the connection matrix 1902 can include two of the output instances of the switch blocks 930 in a single partition. Two of the output instances of the switch blocks 930 connectivity information can be transferred to one of the packing pipeline elements 2402 of FIG. 24.

Timing of the submission of connectivity information is crucial. A band of input connectivity information passes in synchronous to the arrival of the associated horizontal color vector. As one of the horizontal color vectors 2310 completes a cycle through the pipeline, it is recycled through the first stage.

When one of the horizontal color vectors 2310 recycles, the regulating control logic introduces the next band of input connectivity information synchronous to arrival of the horizontal color vector information. The result is a continuously cycling of the horizontal color vectors 2310 that step down the input switch blocks, and connectivity information that is introduced in consecutive blocks that are offset by the size of the connectivity port to the repack block.

For instance, if the connectivity port supports four input ports worth of information, the sequence will be the first four from the first switch block, the first four from the second switch block, and so on until the final switch block has submitted its four vectors appropriate to the output ports associated with the pipeline stage. Then the second four inputs ports worth of information from the first switch block will be submitted, followed by the second four inputs ports worth of information from the second switch block, and so on until all the inputs are satisfied on all the ingress stage instances of the switch blocks.

Figure 26:
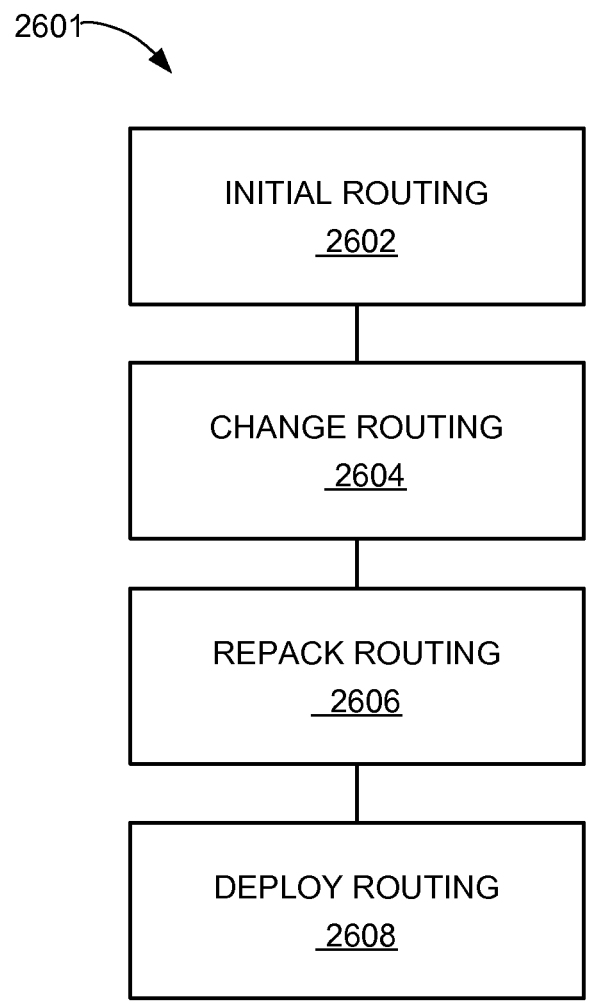
FIG. 26, is a control flow for arbitrary hitless reconfiguration of the data plane.

Referring now to FIG. 26, therein is shown a control flow 2601 for arbitrary hitless reconfiguration of the data plane 920 of FIG. 9. The computing system 100 of FIG. 1 can reconfigure the switching network 1050 of FIG. 10 to route the data connections 912 of FIG. 9 from the ingress stage 1110 of FIG. 10 to the egress stage 1130 of FIG. 11 in real-time without affecting the flow of existing instances of the data connections 912.

Arbitrary hitless reconfiguration allows the switching network 1050 to receive new switching information and configure each stage of the switching network 1050 without affecting existing data traffic of the data connections 912. The switching information can include the repacking route 2304 of FIG. 23.

The new route can be deployed synchronously with the progress of the existing data traffic of the data connections 912 through the switching network 1050 such that each stage of the switching network 1050 can deploy the new switching configuration immediately after the data traffic of the data connections 912 has transited that stage of the switching network 1050.

The computing system 100 can include the data plane 920 for transporting data. The data plane 920 can be implemented using the switching network 1050 to route the data traffic of the data connections 912 between the data sources 906 of FIG. 9 and the data destinations 908 of FIG. 9.

The computing system 100 can calculate the data connections 912, such as an initial data connection, for the switching network 1050 in an initial routing module 2602. The computing system 100 can map an initial set of the data connections 912 across the switching network 1050. For example, the data connections 912 can be calculated using the loosely coupled packing pipeline 2302 of FIG. 23 coupled to the switch control 1020 of FIG. 10.

Each of the data connections 912 can traverse from one of the ingress stage input ports 1114 of FIG. 11 of the ingress stage 1110 through the center nodes 1122 of FIG. 11 of the center stage 1120 of FIG. 11 to one of the egress stage output ports 1136 of FIG. 11. The data connections 912 can be routed through the center switching node 1140 of FIG. 11 of the center stage 1120.

The center switching node 1140 is one of the center nodes 1122 used for routing the data connections 912. The center switching node 1140 is determined using the packing strategy by routing through the most well used portion of the switching network 1050. For example, the center switching node 1140 can be one of the switch blocks 930 of FIG. 9.

The switching network 1050 can be a crossbar equivalent network that can route any of the ingress stage input ports 1114 of the ingress stage 1110 to any of the egress stage output ports 1136. The switching network 1050 can be a multi-stage switching network 1050 having the ingress stage 1110, the center stage 1120, and the egress stage 1130. The connection matrix 1902 of FIG. 19 can define the routing to be implemented on the switching network 1050 to route each of the data connections 912 between the ingress stage 1110 and the egress stage 1130.

The ingress stage 1110 can include the ingress nodes 1112 of FIG. 11 each having ingress stage input ports 1114 that can be configured to receive data of the data connections 912. The egress stage 1130 can include egress nodes 1132 of FIG. 11 each having egress stage output ports 1136 that can be configured to transfer the data of the data connection.

The center stage 1120 can include center nodes 1122 that can route data received from the ingress stage input ports 1114 to one of the egress stage output ports 1136. The connection matrix 1902 can defined the routing of the ingress stage input ports 1114 to the egress stage output ports 1136.

For example, the ingress stage input ports 1114 can receive data from the virtual bus 722 of FIG. 7 and route the data to the center nodes 1122. For example, the virtual bus 722 can represent a flow of control and data signals between two of the application fragments 902 of FIG. 9.

The computing system 100 can detect a change in the status of the data connections 912 in a change routing module 2604. The change routing module 2604 can include detecting the formation of one of the data connections 912, the termination of one of the data connections 912, or similar status changes.

For example, the change routing module 2604 can detect the termination status 914 of FIG. 9 for one of the data connections 912 indicating that one of the data connections 912 has been ended and the associated resources can be made available for reuse. In another example, the module manager 712 of FIG. 7 can detect the termination status 914 of FIG. 9.

The computing system 100 can calculate the repacking route 2304 for the switching network 1050 in a repack routing module 2606. The repack routing module 2606 can use the connection matrix 1902 to calculate the repacking route 2304 and to optimize the usage of the center stage 1120 of the switching network 1050 by routing one of the data connections 912, such as a repacked data connection, through the center nodes 1122 having the highest current usage.

The repacking route 2304 can be calculated using the packing strategy to route the data connections 912 through the most well used portions of the routine network 1050. For example, if one of the center nodes 1122 with a configuration of eight input and eight output connections has seven existing connections, then the repack routing module 2606 can tend to route an additional on one of the data connections 912 through the instances of the center nodes 1122 having the seven existing connections. The center nodes 1122 can include a node packing factor 1123 of FIG. 11 to indicate the level of usage of one of the center nodes 1122 and the location of one of the center nodes 1122 within the center stage 1120.

The repacking route 2304 can include routing information for each stage of a multi-stage network. For example, in a three-stage Clos network having the ingress stage 1110, the center stage 1120, and the egress stage 1130, the repacking route 2304 can include information for routing the data connections 912 through each stage of the switching network 1050.

The repacking route 2304 can be calculated using the loosely coupled packing pipeline 2302. The connection matrix 1902 can be partitioned based on the size of the switch blocks 930 of the switching network 1050 and sent to the loosely coupled packing pipeline 2302.

The resulting instance of the repacking route 2304 can be calculated asynchronously and the repacking route 2304 can be deployed to the switching network 1050. The repacking route 2304 can be calculated using a packing strategy to reuse the most used portion of the switching network 1050. The loosely coupled packing pipeline 2302 can be coupled to the switching network 1050.

The repacking route 2304 can include the ingress portion 2202 of FIG. 22 to describe the routing of the data connections 912 from the ingress stage input ports 1114 to the center nodes 1122. When the ingress portion 2202 is completely deployed in the ingress stage 1110, the ingress stage 1110 can route each of the data connections 912 from one of the ingress stage input ports 1114 to one of the center nodes 1122.

The ingress portion 2202 can be distributed to the ingress nodes 1112 of the ingress stage 1110 in a variety of ways. For example, the ingress portion 2202 can be broadcast simultaneously to all of the ingress nodes 1112 using a multicast. In another example, the ingress portion 2202 can be broadcast simultaneously to only the instances of the ingress nodes 1112 included in the ingress portion 2202.

The repacking route 2304 can include the center portion 2204 of FIG. 22 to describe the routing of the data connections 912 from the center nodes 1122 to one of the egress nodes 1132. When the center portion 2204 is completely deployed in the center stage 1120, the center stage 1120 can route each of the data connections 912 to one of the egress nodes 1132.

The center portion 2204 can be distributed to the center nodes 1122 of the center stage 1120 in a variety of ways. For example, the center portion 2204 can be broadcast simultaneously to all of the center nodes 1122 using a multicast technique. In another example, the center portion 2204 can be broadcast simultaneously to only the instances of the center nodes 1122 included in the center portion 2204.

The repacking route 2304 can include the egress portion 2206 of FIG. 22 to describe the routing of the data connections 912 from the egress nodes 1132 to one of the egress stage output ports 1136. When the egress portion 2206 is completely deployed in the egress stage 1130, the egress stage 1130 can route each of the data connections 912 to one of the egress stage output ports 1136.

The egress portion 2206 can be distributed to the egress nodes 1132 of the egress stage 1130 in a variety of ways. For example, the egress portion 2206 can be broadcast simultaneously to all of the egress nodes 1132 using a multicast technique. In another example, the egress portion 2206 can be broadcast simultaneously to only the instances of the egress nodes 1132 included in the egress portion 2206.

It has been discovered that the computing system 100 increases performance and avoids network blocking by implementing the repacking strategy to optimize the switching network 1050. By detecting the termination of an existing data connection through the switching network 1050, reallocating the resources of the data connection, and recalculating a new instance of the repacking route 2304 for the switching network 1050 to reroute the other existing data connections 912 optimized for packing. The termination of the existing data connections 912 can be detected by setting the termination status 914 for the existing data connections 912 to indicate that the existing data connections 912 has been terminated.

The computing system 100 can deploy the repacking route 2304 to the switching network 1050 in a deploy routing module 2608. The deploy routing module 2608 can broadcast the repacking route 2304 to the switching network 1050 to change the routing configuration of the data connections 912.

The repacking route 2304 can be deployed to reconfigure the switching network 1050 in a synchronous fashion to allow the data currently being routed through the switching network 1050 to arrive at the intended destination without interruption. Hitless reconfiguration of the switching network 1050 deploys portions of the repacking route 2304 to stages of the switching network 1050 in sequential order stage by stage as the existing data traffic progresses through the switching network 1050. For example, one of the data connections 912, such as the repacked data connection, can be formed by deploying the repacking route 2304 on the switching network 1050 after the repacking route 2304 has been broadcast to the stages of the switching network 1050.

The switch control 1020 of FIG. 10 can control deploying the portions of the repacking route 2304 sequentially to each stage of the switching network 1050. By sequentially changing the routing configuration of each stage directly after the previous data has been routed through the stage, the new routing configuration can be rolled into the switching network 1050 without affecting the currently routed data.

For example, in a three-stage switching network, the ingress portion 2202 of the repacking route 2304 can be distributed to all of the ingress nodes 1112 of the ingress stage 1110 at a designated time point when the existing data of the data connections 912 has just moved from the ingress stage 1110 to the center stage 1120. The ingress portion 2202 can reconfigure the ingress stage 1110 to implement the repacking route 2304 and route the data connections 912 to their next routing destination as indicated by the repacking route 2304.

Sequential routing requires that the repacking route 2304 be partitioned for each stage and that the routing information for each stage is deployed to the stage in the order and direction that the data passes through the switching network 1050. For example, in a three-stage routine network, the repacking route 2304 can be partitioned into the ingress portion 2202, the center portion 2204, and the egress portion 2206. Each portion of the repacking route 2304 can then be deployed to the respective stage and change the routing configuration of that stage of the switching network 1050.

The repacking route 2304 can be distributed to the switching network 1050 in a variety of ways. For example, the portions of the repacking route 2304 can be distributed to each stage of the switching network 1050 by broadcasting the portion to each respective node in the stage simultaneously. In another example, the portions of the repacking route 2304 can be simultaneously distributed to all of the nodes of each stage using a direct bus connection. In yet another example, the repacking route 2304 can be broadcast to all nodes of the switching network 1050 simultaneously.

Each stage of the repacking route 2304 can be deployed only after the previous stage has been completed deployed. For example, the center portion 2204 can be deployed to the center stage 1120 after the ingress portion 2202 has been completely deployed to the ingress stage 1110. The egress portion 2206 can be deployed to the egress stage 1130 after the center portion 2204 has been completely deployed to the center stage 1120. After all three portions of the repacking route 2304 have been deployed to the switching network 1050, the switching network 1050 can implement the connection matrix 1902 of the repacking route 2304.

It has been discovered that the computing system 100 provides improved data integrity by implementing real-time reconfiguration of the switching network 1050 to prevent interruptions in the flow of data in the computing system 100. Broadcasting the ingress portion 2202, the center portion 2204, and the egress portion 2206 to the switching network 1050 allows the parallel loading and sequential implementation of the routing information in different stages of the switching network 1050 to prevent interference with the data already flowing in the switching network 1050.

It has been discovered that deploying the repacking route 2304 to sequential stages of the switching network 1050 synchronously with the data already flowing in the switching network 1050 provides increased performance by avoiding restarting the data connections 912. Deploying the repacking route 2304 in vacated stages of the switching network 1050 allows hitless reconfiguration of the switching network 1050.

Figure 27:
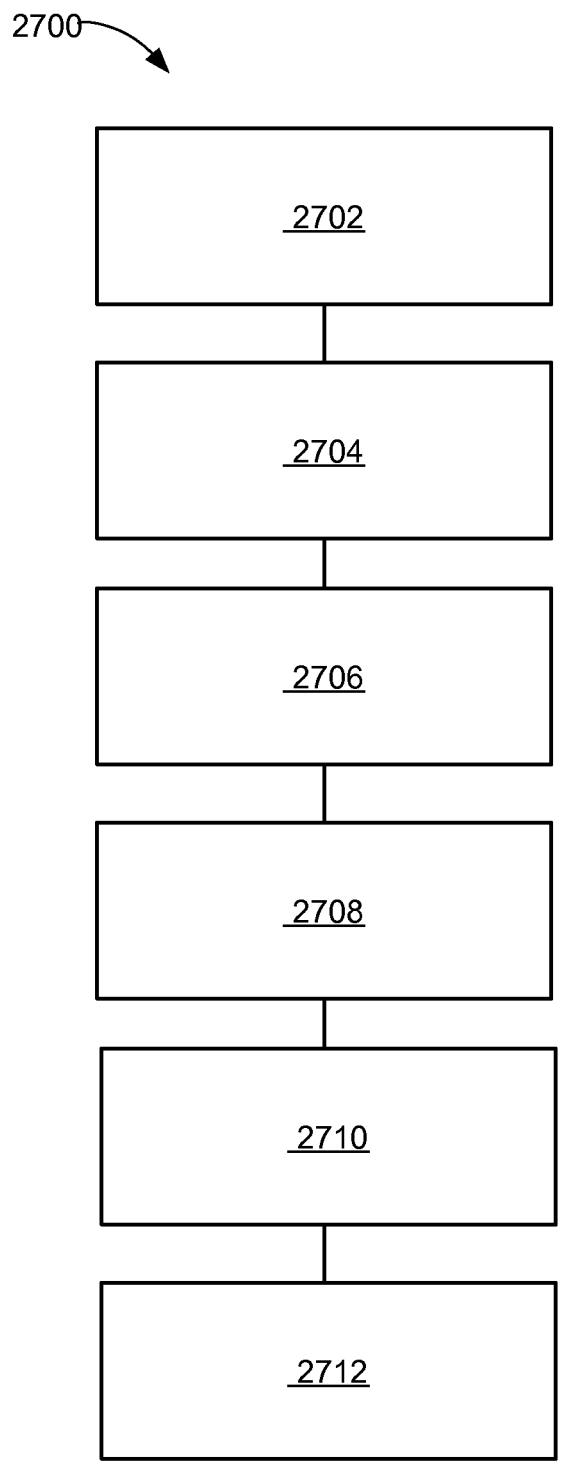
FIG. 27 is a flow chart of a method of operation of the computing system in a further embodiment of the present invention.

Referring now to FIG. 27, therein is shown a flow chart of a method 2700 of operation of the computing system in a further embodiment of the present invention. The method 2700 includes: calculating an initial data connection traversing a center state node of a switching network having an ingress stage, a center stage, and an egress stage in a block 2702; calculating a repacking route across the switching network traversing the center switching node in a block 2704; broadcasting an ingress portion of the repacking route simultaneously to ingress nodes of the ingress stage in a block 2706; broadcasting a center portion of the repacking route simultaneously to center nodes of the center stage with the ingress portion completely deployed in a block 2708; broadcasting an egress portion of the repacking route simultaneously to egress nodes of the egress stage with the center portion completely deployed in a block 2710; and deploying a repacked data connection with the repacking route traversing the center switching node across the switching network synchronously with the initial data connection in a block 2712.

Thus, it has been discovered that the hardware operating system of the present invention furnishes important and heretofore unknown and unavailable solutions, capabilities, and functional aspects for a computing system with routing. The resulting method, process, apparatus, device, product, or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operating a computing system comprising:

calculating an initial data connection traversing a center switching node of a switching network having an ingress stage, a center stage, and an egress stage;

calculating a repacking route across the switching network traversing the center switching node or hitless reconfiguration of the switching network, the repacking route for dynamically reconfiguring the switching network having a reconfigurable hardware device;

broadcasting an ingress portion of the repacking route simultaneously with receiving the ingress portion at ingress nodes of the ingress stage;

broadcasting a center portion of the repacking route simultaneously with receiving the center portion at center nodes of the center stage with the ingress portion completely deployed;

broadcasting an egress portion of the repacking route simultaneously with receiving the egress portion at egress nodes of the egress stage with the center portion completely deployed; and deploying a repacked data connection with the repacking route traversing the center switching node across the switching network synchronously with the transit of the data of the initial data connection, the repacking route for dynamically reconfiguring the reconfigurable hardware device.

2. The method as claimed in claim 1 further comprising: calculating a center switching node of the initial data connection based on a node packing factor for determining a level of usage of the center switching node.

3. The method as claimed in claim 1 further comprising: detecting a termination status of the initial data connection; and wherein:
calculating the repacking route includes calculating the repacking route based on the termination status of the initial data connection.

4. The method as claimed in claim 1 wherein deploying the repacked data connection includes forming a virtual bus over the repacked data connection for routing data between a data source and a data destination.

5. The method as claimed in claim 1 wherein calculating the repacking route includes partitioning a connection matrix for mapping the ingress stage to the egress stage based on a number of switch block input ports.

6. The method as claimed in claim 1 wherein calculating the initial data connection includes:
routing the initial data connection through the center nodes; and
calculating the center nodes with the center nodes having at least one of the center stage input ports unused.

7. The method as claimed in claim 1 further comprising: calculating a switch map of the center switching node for mapping the repacking route from the ingress stage to the egress stage.

8. The method as claimed in claim 1 wherein forming the initial data connection includes:
routing the initial data connection through the center nodes, the center nodes having with the least number of center stage input ports available; and
selecting the center nodes having at least one of the center stage input ports unused.

9. The method as claimed in claim 1 further comprising: mapping an application fragment to an ingress stage input port; and
mapping an egress stage output port to another application fragment.

10. The method as claimed in claim 1 wherein broadcasting the center portion of the repacking route includes broadcasting the repacking route simultaneously to the center portion of the switching network.

11. A system of operating a computing system comprising: a switch control for calculating an initial data connection; a loosely coupled packing pipeline, coupled to the switch control, for calculating a repacking route; and a switching network, coupled to the loosely coupled packing pipeline, for deploying a repacked data connection synchronously with the transit of the data of the initial data connection includes:
ingress nodes for receiving an ingress portion of the repacking route broadcast simultaneously to the ingress nodes,
center nodes for receiving a center portion of the repacking route broadcast simultaneously to the center nodes, and
egress nodes for receiving an egress portion of the repacking route broadcast simultaneously to the egress nodes; and:
wherein:
the repacking route is for hitless reconfiguration of the switching network,
the repacking route is for dynamic reconfiguration of the switching network reconfigurable hardware device, and
the repacking route is for dynamic reconfiguration of the reconfigurable hardware device.

12. The system as claimed in claim 11 wherein the switching network include a packing pipeline element for calculating a center switching node of the initial data connection.

13. The system as claimed in claim 11 further comprising: a buffer manager, coupled to the switch control, for detecting a termination status of the initial data connection; and
wherein:
the loosely coupled packing pipeline is for calculating the repacking route based on the termination status of the initial data connection.

14. The system as claimed in claim 11 further comprising a virtual bus logic unit, coupled to the switch control, for forming a virtual bus over the repacked data connection for routing data between a data source and a data destination.

15. The system as claimed in claim 11 where the loosely coupled packing pipeline is for partitioning a connection matrix for mapping the ingress stage to the egress stage based on a number of switch block input ports.

16. The system as claimed in claim 11 wherein the switching network includes a switch block for calculating a center switching node having at least one of a center stage input ports unused.

17. The system as claimed in claim 11 wherein the switching network includes a switch block for calculating a switch map of a center switching node between an ingress stage to an egress stage.

18. The system as claimed in claim 11 wherein the loosely coupled packing pipeline includes a packing pipeline element for routing the initial data connection through the center nodes, a center switching node having a least number of center stage input ports available and at least one of the center stage input ports unused.

19. The system as claimed in claim 11 further comprising a module manager, coupled to the switching network, for mapping an application fragment to an ingress stage input port and for mapping an egress stage output port to another application fragment.

20. The system as claimed in claim 11 wherein the switch control is for broadcasting the repacking route simultaneously to the center portion of the switching network.

* * * * *